(12) United States Patent
Takechi

(10) Patent No.: US 12,224,353 B2
(45) Date of Patent: Feb. 11, 2025

(54) THIN-FILM TRANSISTOR CIRCUIT AND METHOD OF MANUFACTURING THIN-FILM TRANSISTOR CIRCUIT

(71) Applicant: Wuhan Tianma Micro-Electronics Co., Ltd., Wuhan (CN)

(72) Inventor: Kazushige Takechi, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 392 days.

(21) Appl. No.: 17/521,261

(22) Filed: Nov. 8, 2021

(65) Prior Publication Data
US 2022/0149202 A1    May 12, 2022

(30) Foreign Application Priority Data

Nov. 11, 2020  (JP) ................. 2020-188268

(51) Int. Cl.
*H01L 29/786*   (2006.01)
*H01L 21/02*    (2006.01)
(Continued)

(52) U.S. Cl.
CPC .... *H01L 29/7869* (2013.01); *H01L 21/02565* (2013.01); *H01L 27/1225* (2013.01);
(Continued)

(58) Field of Classification Search
CPC ........... H01L 29/7869; H01L 29/66757; H01L 29/66969; H01L 29/78675; H01L 21/02565; H01L 21/768; H01L 21/70; H01L 27/1225; H01L 27/1251; H01L 27/1255; H01L 27/127; H01L 27/1222;
(Continued)

(56) References Cited

U.S. PATENT DOCUMENTS

2005/0045970 A1   3/2005  Arikado et al.
2013/0187150 A1   7/2013  Yamazaki et al.
(Continued)

FOREIGN PATENT DOCUMENTS

JP   2013-168646 A   8/2013
JP   2013-214732 A   10/2013

OTHER PUBLICATIONS

JP Office Action issued on Dec. 3, 2024 for JP Patent Application No. 2020-188268.

*Primary Examiner* — Mohammad A Rahman
*Assistant Examiner* — Sandra Milena Rodriguez Villan
(74) *Attorney, Agent, or Firm* — Sughrue Mion, PLLC

(57) ABSTRACT

A polysilicon layer includes a polysilicon part of a polysilicon thin-film transistor. A first conductor layer includes a first gate electrode part of the polysilicon thin-film transistor. The first insulator layer includes a first insulator part located between the first gate electrode part and the polysilicon part. The oxide semiconductor layer includes an oxide semiconductor part of an oxide semiconductor thin-film transistor. The second conductor layer includes a second gate electrode part of the oxide semiconductor thin-film transistor. The second insulator layer includes a second insulator part located between the second gate electrode part and the oxide semiconductor part. The second insulator layer has a relative permittivity of not less than 8. The entire area of the second insulator layer is covered with the second conductor layer.

7 Claims, 16 Drawing Sheets

(51) Int. Cl.
*H01L 27/12* (2006.01)
*H01L 29/66* (2006.01)
*H10K 59/121* (2023.01)

(52) U.S. Cl.
CPC ...... *H01L 27/1251* (2013.01); *H01L 27/1255* (2013.01); *H01L 27/127* (2013.01); *H01L 29/66757* (2013.01); *H01L 29/66969* (2013.01); *H01L 29/78675* (2013.01); *H10K 59/1213* (2023.02); *H10K 59/1216* (2023.02)

(58) Field of Classification Search
CPC .............. H01L 23/535; H10K 59/1213; H10K 59/1216; H10K 59/12
See application file for complete search history.

(56) References Cited

U.S. PATENT DOCUMENTS

| | | |
|---|---|---|
| 2013/0234131 A1 | 9/2013 | Tanaka et al. |
| 2018/0033849 A1 | 2/2018 | Noh et al. |
| 2018/0061914 A1 | 3/2018 | Jeong et al. |
| 2018/0277614 A1* | 9/2018 | Ono .................. H10K 59/1216 |
| 2018/0308869 A1 | 10/2018 | Suzumura et al. |
| 2019/0115474 A1* | 4/2019 | Yamazaki ......... H01L 29/78648 |
| 2020/0220028 A1 | 7/2020 | Yamazaki et al. |
| 2020/0266190 A1* | 8/2020 | Radosavljevic .... H01L 29/7787 |
| 2021/0050398 A1* | 2/2021 | Kim .................. H10K 59/1216 |
| 2022/0293798 A1 | 9/2022 | Yamazaki et al. |

* cited by examiner

THIN-FILM TRANSISTOR CIRCUIT AND METHOD OF MANUFACTURING THIN-FILM TRANSISTOR CIRCUIT

CROSS-REFERENCE TO RELATED APPLICATIONS

This non-provisional application claims priority under 35 U.S.C. § 119(a) on Patent Application No. 2020-188268 filed in Japan on Nov. 11, 2020, the entire content of which is hereby incorporated by reference.

BACKGROUND

This disclosure relates to a thin-film transistor circuit and a method of manufacturing a thin-film transistor circuit.

A technology of incorporating a low-temperature polysilicon thin-film transistor (LTPS TFT) and an oxide semiconductor TFT into one circuit is available for practical use. For example, pixel circuits including a low-temperature polysilicon TFT and an oxide semiconductor TFT are proposed. Incorporating a low-temperature polysilicon TFT having high mobility and an oxide semiconductor TFT that generates small leakage current in a circuit achieves improvement in characteristics and reduction in power consumption of the circuit.

Since the mobility of an oxide semiconductor TFT is low, employment of a high-k insulator for the gate insulator of the oxide semiconductor TFT is proposed to raise the on-current or lower the driving voltage of the oxide semiconductor TFT.

SUMMARY

An aspect of this disclosure is a thin-film transistor circuit including: a polysilicon layer; a first conductor layer located upper than the polysilicon layer; a first insulator layer located between the first conductor layer and the polysilicon layer; an oxide semiconductor layer; a second conductor layer located upper than the oxide semiconductor layer; and a second insulator layer located between the second conductor layer and the oxide semiconductor layer. The polysilicon layer includes a polysilicon part of a polysilicon thin-film transistor. The first conductor layer includes a first gate electrode part of the polysilicon thin-film transistor. The first insulator layer includes a first insulator part located between the first gate electrode part and the polysilicon part. The oxide semiconductor layer includes an oxide semiconductor part of an oxide semiconductor thin-film transistor. The second conductor layer includes a second gate electrode part of the oxide semiconductor thin-film transistor. The second insulator layer includes a second insulator part located between the second gate electrode part and the oxide semiconductor part. The second insulator layer has a relative permittivity of not less than 8. The entire area of the second insulator layer is covered with the second conductor layer.

An aspect of this disclosure is a method of manufacturing a thin-film transistor circuit. The method includes: forming a polysilicon layer including a polysilicon part of a polysilicon thin-film transistor; forming a first insulator layer including an insulator part of the polysilicon thin-film transistor on a layer upper than the polysilicon layer; forming a first conductor layer including a gate electrode part of the polysilicon thin-film transistor on a layer upper than the first insulator layer; forming an oxide semiconductor layer including an oxide semiconductor part of an oxide semiconductor thin-film transistor; forming a second insulator layer including an insulator part of the oxide semiconductor thin-film transistor on a layer upper than the oxide semiconductor layer; and forming a second conductor layer including a gate electrode part of the oxide semiconductor thin-film transistor on a layer upper than the second insulator layer. The second insulator layer has a relative permittivity of not less than 8. The second conductor layer and the second insulator layer are etched together or the second insulator layer is etched using the second conductor layer as a mask.

It is to be understood that both the foregoing general description and the following detailed description are exemplary and explanatory and are not restrictive of this disclosure.

EMBODIMENTS

Figure 1:
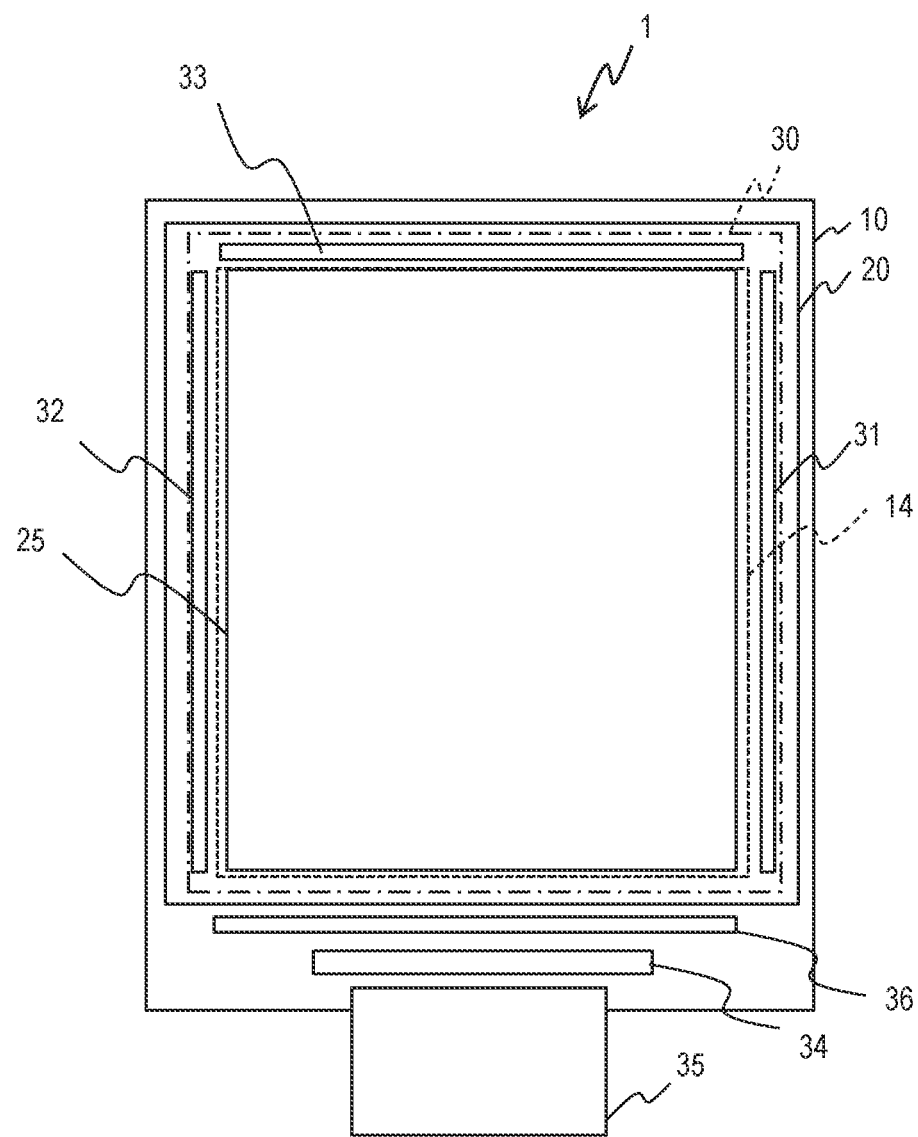
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs and some elements in the drawings are exaggerated in size or shape for clear understanding of the description.

Overview

The following description employs an organic light-emitting diode (OLED) display device as an example of a device including a thin-film transistor circuit. The OLED display device in this disclosure includes a low-temperature polysilicon thin-film transistor (LTPS TFT) and an oxide semiconductor TFT in a pixel circuit and/or a peripheral circuit. An example of the oxide semiconductor is indium gallium zinc oxide (IGZO).

An oxide semiconductor TFT generates small leakage current and accordingly, it can be used as a switch transistor connected with a storage capacitor (capacitive element) for maintaining the gate potential of a driving transistor in a pixel circuit, for example. A low-temperature polysilicon TFT having high mobility can be used as a driving transistor, for example. The configuration of this disclosure is applicable to devices other than display devices.

In one embodiment, the oxide semiconductor TFT has a top-gate structure and its gate insulator part is made of a high-k insulator having a high relative permittivity. The high-k insulator in the following description has a relative permittivity of not less than 8. Using an insulator having a high relative permittivity for the gate insulator part improves the on-current characteristics of the oxide semiconductor TFT, so that the device can have a smaller size or lower driving voltage. An example of a high-k insulator has a relative permittivity of not more than 100 and another example has a relative permittivity of not more than 50.

In a thin-film transistor circuit having a layered structure, the gate electrode part of an oxide semiconductor TFT is included in one conductor layer and the gate insulator part of the oxide semiconductor TFT is included in one high-k insulator layer. The oxide semiconductor part of the oxide semiconductor TFT is included in one oxide semiconductor layer.

The gate electrode part, the gate insulator part, and the oxide semiconductor part are parts of an oxide semiconductor TFT and each of them is the whole or a part of a film of specific material. One layer is made of the same material by the same process and can consist of one unseparated film or a plurality of separate films. One film can have a single layer structure or a multilayered structure.

In one embodiment, the entire area of the aforementioned high-k insulator layer in the thin-film transistor circuit is covered with the area of a conductor layer including the gate electrode part when viewed in the layering direction (in a planar view). This configuration suppresses generation of parasitic capacitance caused by the high-k insulator. In one pixel circuit of one embodiment, the high-k insulator layer includes the gate insulator part of an oxide semiconductor TFT. In one pixel circuit of another embodiment, the high-k insulator layer further includes the insulator part of a storage capacitor for maintaining the gate potential of the driving TFT. This configuration allows reduction in area of the storage capacitor.

In the former pixel circuit of the one embodiment, the conductor or semiconductor that is located lower than the insulator layer including the gate insulator part and overlaps the insulator layer is only the oxide semiconductor part of the oxide semiconductor TFT. In the latter pixel circuit of the other embodiment, the conductor or semiconductor that is located lower than the insulator layer including the gate insulator part and overlaps the insulator layer in the layering direction are only the oxide semiconductor part of the oxide semiconductor TFT and the lower electrode part of the storage capacitor.

Embodiment 1

Configuration of Display Device

FIG. 1 schematically illustrates a configuration example of an OLED display device 1. The OLED display device 1 includes a thin-film transistor (TFT) substrate 10 on which organic light-emitting elements (OLED elements) and pixel circuits are fabricated, an encapsulation substrate 20 for encapsulating the organic light-emitting elements, and a bond (glass frit sealer) 30 for bonding the TFT substrate 10 with the encapsulation substrate 20. The space between the TFT substrate 10 and the encapsulation substrate 20 is filled with dry nitrogen and sealed up with the bond 30. The encapsulation substrate 20 and the bond 30 constitute a structural encapsulation unit. The structural encapsulation unit can be a thin-film encapsulation (TFE).

In the periphery of a cathode electrode region 14 outer than the display region 25 of the TFT substrate 10, a scanning driver 31, an emission driver 32, a protection circuit 33, a driver IC 34, and a demultiplexer 36 are provided. The driver IC 34 is connected to the external devices via flexible printed circuits (FPC) 35. The scanning driver 31, the emission driver 32, and the protection circuit 33 are peripheral circuits fabricated on the TFT substrate 10.

The scanning driver 31 drives scanning lines on the TFT substrate 10. The emission driver 32 drives emission control lines to control the light emission periods of pixels. The driver IC 34 is mounted with an anisotropic conductive film (ACF), for example.

The protection circuit 33 protects the elements in the pixel circuits from electrostatic discharge. The driver IC 34 provides power and timing signals (control signals) to the scanning driver 31 and the emission driver 32 and further, provides power and a data signal to the demultiplexer 36.

The demultiplexer 36 outputs output of one pin of the driver IC 34 to d data lines in series (d is an integer larger than 1). The demultiplexer 36 changes the data line to output the data signal from the driver IC 34 d times per scanning period to drive d times as many data lines as output pins of the driver IC 34.

Configuration of Pixel Circuit

Figure 2:
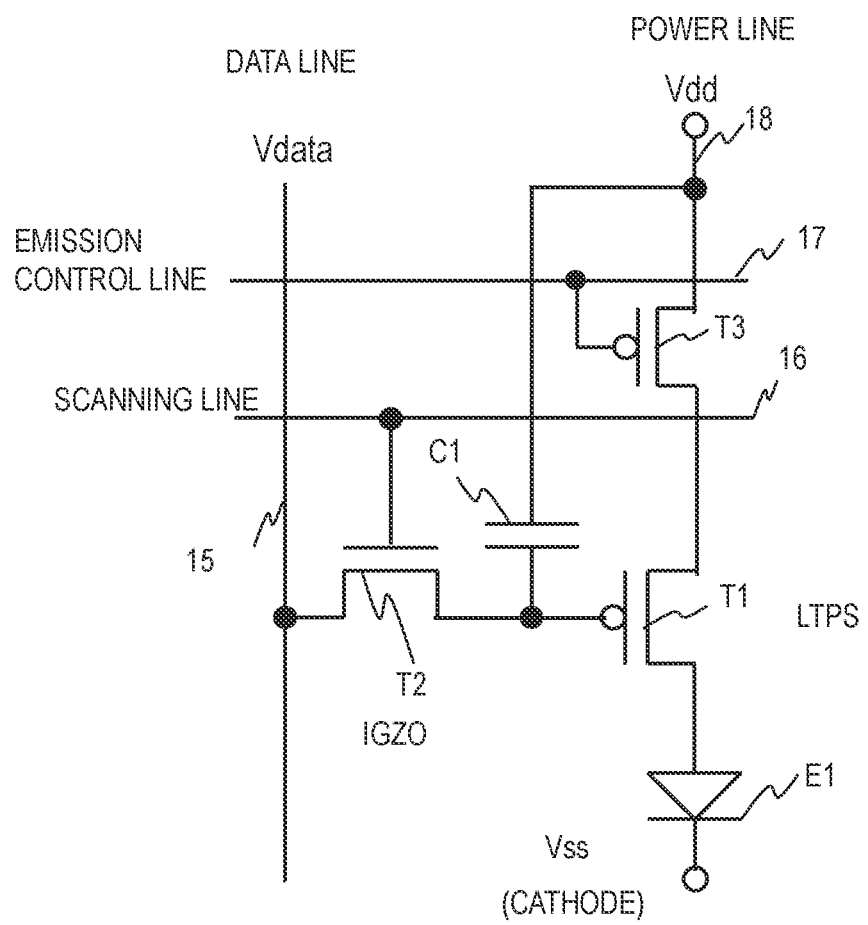
FIG. 2 illustrates a configuration example of a pixel circuit.

A plurality of pixel circuits are fabricated on the TFT substrate 10 to control electric current to be supplied to the anode electrode parts of subpixels (also simply referred to as pixels). FIG. 2 illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs. The transistors except for the driving transistor T1 are switch transistors.

The selection transistor T2 is a switch for selecting the subpixel. The selection transistor T2 is an n-channel type of oxide semiconductor TFT and its gate terminal is connected with a scanning line 16. The source terminal is connected with a data line 15. The drain terminal is connected with the gate terminal of the driving transistor T1.

The driving transistor T1 is a transistor (driving TFT) for driving the OLED element E1. The driving transistor T1 is a p-channel type of low-temperature polysilicon TFT and its gate terminal is connected with the drain terminal of the selection transistor T2. The source terminal of the driving transistor T1 is connected with the drain terminal of the emission transistor T3 and the drain terminal of the driving transistor T1 is connected with the OLED element E1. The storage capacitor C1 is provided between the gate terminal of the driving transistor T1 and a power line 18.

The emission transistor T3 is a switch for controlling supply/stop of the driving current to the OLED element E1. The emission transistor T3 is a p-channel type of low-temperature polysilicon TFT and its gate terminal is connected with an emission control line 17. The source terminal of the emission transistor T3 is connected with the power line 18 and the drain terminal of the emission transistor T3 is connected with the source terminal of the driving transistor T1.

Next, operation of the pixel circuit is described. The scanning driver 31 outputs a selection pulse to the scanning line 16 to turn on the selection transistor T2. The data voltage supplied from the driver IC 34 through the data line 15 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 32 outputs a control signal to the emission control line 17 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3. The circuit configuration in FIG. 2 is merely an example; the pixel circuit can have a different configuration.

Configuration of TFT Substrate

Hereinafter, a configuration example of a TFT substrate including low-temperature polysilicon TFTs and oxide semiconductor TFTs is described. The oxide semiconductor can be IGZO. The configurations described in this specification are applicable to circuits including TFTs of other kinds of oxide semiconductors.

Figure 3:
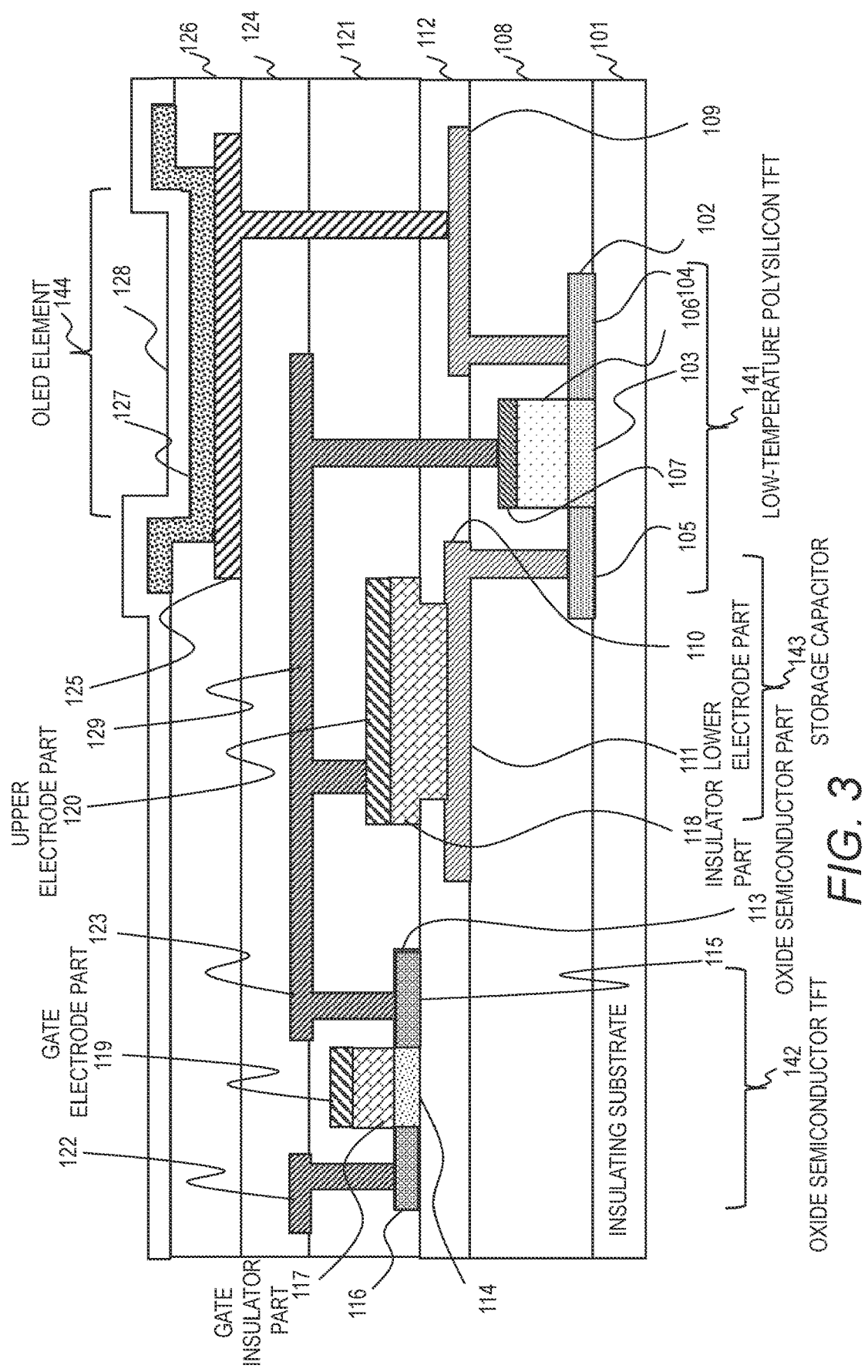
FIG. 3 schematically illustrates a cross-sectional structure of a part of a TFT substrate.

FIG. 3 schematically illustrates a cross-sectional structure of a part of a TFT substrate. A low-temperature polysilicon TFT 141, an oxide semiconductor TFT 142, a storage capacitor 143, and an OLED element 144 are fabricated on an insulating substrate 101. These elements correspond to the driving transistor T1, the selection transistor T2, the storage capacitor C1, and the OLED element E1 in FIG. 2.

The insulating substrate 101 is a flexible or inflexible substrate made of resin or glass. The low-temperature polysilicon TFT 141 includes a low-temperature polysilicon part 102. The low-temperature polysilicon part 102 can be one island-like low-temperature polysilicon active film and includes source/drain regions 104 and 105 and a channel region 103 sandwiched between the source/drain regions 104 and 105 in an in-plane direction.

The source/drain regions 104 and 105 are made of low-temperature polysilicon reduced in resistance by being doped with high-concentration impurities; they are connected with source/drain electrode parts 109 and 110. The channel region 103 is made of low-temperature polysilicon not reduced in resistance (highly-resistive low-temperature polysilicon).

The low-temperature polysilicon part 102 is included in a low-temperature polysilicon layer. The low-temperature polysilicon layer includes the low-temperature polysilicon parts of low-temperature polysilicon TFTs in a plurality of pixel circuits. The low-temperature polysilicon layer is formed directly on the insulating substrate 101. Although the low-temperature polysilicon part 102 in the example of FIG. 3 is in contact with the insulating substrate 101, another insulator layer such as a silicon nitride layer can be provided therebetween.

The low-temperature polysilicon TFT 141 has a top-gate structure. The low-temperature polysilicon TFT 141 can have a bottom gate in addition to the top gate. The same applies to the other embodiments. The low-temperature polysilicon TFT 141 further includes a gate electrode part 107 and a gate insulator part 106 located between the gate electrode part 107 and the channel region 103 in the layering direction. The gate insulator part (first insulator part) 106 is included in an insulator layer (first insulator layer) including the gate insulator parts of the other low-temperature polysilicon TFTs. The channel region 103, the gate insulator part 106, and the gate electrode part 107 are laid in this order from the bottom (the side closer to the insulating substrate 101); the gate insulator part 106 is in contact with the channel region 103 and the gate electrode part 107.

The gate electrode part (first gate electrode part) 107 is made of a conductor and included in a conductor layer (first conductor layer). The gate electrode part 107 can be made of metal. The metal material can be selected desirably from Mo, W, Nb, and Al, for example. In the configuration example in FIG. 3, the metal film including the gate electrode part 107 and the insulating film including the gate insulator part 106 have island-like shapes; the entire area of this insulating film is covered with the metal film. The gate insulator part 106 in this example is made of silicon oxide and included in a silicon oxide layer. This configuration provides the low-temperature polysilicon TFT 141 with high operating stability.

An interlayer insulating film 108 is provided to cover the low-temperature polysilicon part 102, the gate insulator part 106, and the gate electrode part 107. The interlayer insulating film 108 can be a silicon oxide film or a silicon nitride film. The source/drain electrode parts 109 and 110 are provided above the interlayer insulating film 108 and connected with the source/drain regions 104 and 105 through contact holes in the interlayer insulating film 108. The material for the source/drain electrode parts 109 and 110 can be Al or Ti, for example.

The storage capacitor 143 includes a lower electrode part 111, an upper electrode part 120 opposed to the lower electrode part 111, and an insulator part 118 sandwiched between the lower electrode part 111 and the upper electrode part 120. The lower electrode part 111 is located above the interlayer insulating film 108 and continued from the source/ drain electrode part 110. The lower electrode part 111 is included in the same conductor layer as the source/drain electrode parts 109 and 110.

Another interlayer insulating film 112 is laid above the interlayer insulating film 108. The interlayer insulating film 112 can be a silicon oxide film. The interlayer insulating film 112 is provided to cover the lower electrode part 111, the source/drain electrode parts 109 and 110, and the interlayer insulating film 108. The interlayer insulating film 112 has an opening in the part between the lower electrode part 111 and the upper electrode part 120. The insulator part 118 is provided inside and around the periphery of the opening.

The insulator part 118 is made of a high-k insulator; it is in contact with the lower electrode part 111 within the opening and the top surface of the insulator part 118 is in contact with the upper electrode part 120. The whole insulator part of the storage capacitor 143 consists of the high-k insulator part 118 and a part of the interlayer insulating film 112. The high-k insulator can be an insulating metal compound such as a metal oxide or a metal nitride. Specifically, TaOx, AlOx, HfOx, ZrOx, YOx, or NbOx can be employed. The configuration such that at least a part of the insulator part 118 is located in the opening increases the average relative permittivity of the storage capacitor 143 to attain higher electrostatic capacity.

The oxide semiconductor TFT 142 includes an oxide semiconductor part 113. The oxide semiconductor part 113 can be one island-like oxide semiconductor active film and includes source/drain regions 115 and 116 and a channel region 114 sandwiched between the source/drain regions 115 and 116 in an in-plane direction.

The source/drain regions 115 and 116 are made of IGZO reduced in resistance; they are connected with source/drain electrode parts 122 and 123. The channel region 114 is made of IGZO not reduced in resistance (highly resistive IGZO).

The oxide semiconductor part 113 is included in an oxide semiconductor layer. The oxide semiconductor layer includes the oxide semiconductor parts of a plurality of oxide semiconductor TFTs. The oxide semiconductor layer is provided above the interlayer insulating film 112.

The oxide semiconductor TFT 142 has a top-gate structure. The oxide semiconductor TFT 142 can have a bottom gate in addition to the top gate. The same applies to the other embodiments. The oxide semiconductor TFT 142 further includes a gate electrode part 119 and a gate insulator part 117 located between the gate electrode part 119 and the channel region 114 in the layering direction. The channel region 114, the gate insulator part 117, and the gate electrode part 119 are laid in this order from the bottom (the side closer to the insulating substrate 101); the gate insulator part 117 is in contact with the channel region 114 and the gate electrode part 119.

The gate electrode part (second gate electrode part) 119 is made of a conductor and included in a conductor layer (second conductor layer). The gate electrode part 119 can be made of metal. The metal material can be selected desirably from Mo, W, Nb, and Al, for example.

The gate insulator part (second insulator part) 117 is included in a high-k insulator layer (second insulator layer) made of a high-k insulator. The high-k insulator layer includes the insulator part 118 of the storage capacitor 143. The high-k insulator layer includes the insulator parts of the oxide semiconductor TFTs and the storage capacitors of a plurality of pixel circuits. In the configuration example in FIG. 3, the metal film including the gate electrode part 119 and the insulating film including the gate insulator part 117 have island-like shapes; the entire area of the insulating film is covered with the metal film. Although FIG. 3 illustrates one low-temperature polysilicon TFT and one oxide semiconductor TFT, the other low-temperature polysilicon TFTs and oxide semiconductor TFTs in the pixel circuit have the same structures.

An interlayer insulating film 121 is provided to cover the oxide semiconductor part 113, the gate insulator part 117, and the gate electrode part 119 of the oxide semiconductor TFT 142 and the insulator part 118 and the upper electrode part 120 of the storage capacitor 143. The interlayer insulating film 121 covers a part of the interlayer insulating film 112. The interlayer insulating film 121 can be a silicon oxide film.

The source/drain electrode parts 122 and 123 of the oxide semiconductor TFT 142 are provided above the interlayer insulating film 121. The source/drain electrode parts 122 and 123 are connected with the source/drain regions 115 and 116 of the oxide semiconductor TFT 142 through contact holes in the interlayer insulating film 121.

A connector 129 continued from the source/drain electrode part 123 is connected with the upper electrode part 120 of the storage capacitor 143 through a contact hole opened through the interlayer insulating film 121 and further connected with the gate electrode part 107 of the low-temperature polysilicon TFT 141 through a contact hole opened through the interlayer insulating films 121, 112, and 108. The connector 129 interconnects the source/drain electrode part 123, the upper electrode part 120, and the gate electrode part 107. The source/drain electrode parts 122 and 123 and the connector 129 are included in a conductor layer. The material of the conductor layer is selected desirably; for example, Al or Ti can be employed.

An insulative planarization film 124 is laid to cover the exposed parts of the aforementioned conductor layer and the interlayer insulating film 121. The planarization film 124 can be made of an organic material. An anode electrode part 125 is provided above the planarization film 124. The anode electrode part 125 is connected with the source/drain electrode part 109 of the low-temperature polysilicon TFT 141 through a contact hole opened through the planarization film 124 and the interlayer insulating films 121 and 112.

The anode electrode part 125 can include three layers of a transparent film of ITO or IZO, a reflective film of a metal such as Ag, Mg, Al, or Pt or an alloy containing such a metal, and another transparent film as mentioned above, for example. This three-layer structure of the anode electrode part 125 is merely an example; the anode electrode part 125 can have a two-layer structure.

Above the anode electrode part 125, an insulative pixel defining layer 126 is provided to isolate the OLED element 144. The pixel defining layer 126 can be made of an organic material. An organic light-emitting film 127 is provided above the anode electrode part 125. The organic light-emitting film 127 consists of, for example, a hole injection layer, a hole transport layer, a light-emitting layer, an electron transport layer, and an electron injection layer in this order from the bottom. The layered structure of the organic light-emitting film 127 is determined depending on the design.

Furthermore, a cathode electrode part 128 is provided above the organic light-emitting film 127. The cathode electrode part 128 of one OLED element 144 is a part of an unseparated conductor film. The cathode electrode part 128 transmits part of the visible light coming from the organic light-emitting film 127. The stack of the anode electrode part 125, the organic light-emitting film 127, and the cathode electrode part 128 provided within an opening of the pixel defining layer 126 corresponds to an OLED element 144.

Figure 4:
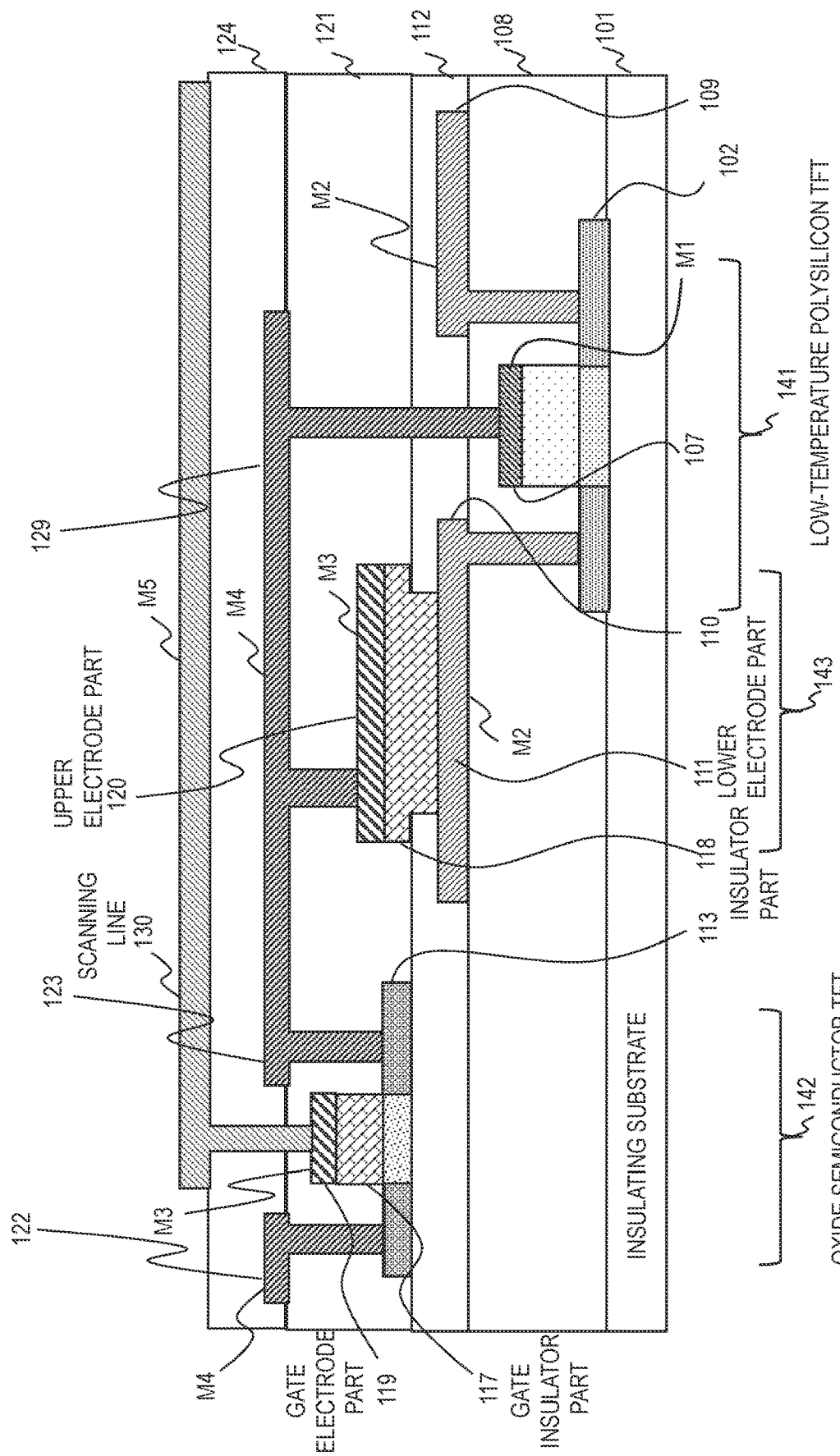
FIG. 4 schematically illustrates a cross-sectional structure of another part of the TFT substrate.

FIG. 4 schematically illustrates a cross-sectional structure of another part of the TFT substrate. FIG. 4 does not include the OLED element 144 included in FIG. 3 but includes a scanning line 130 for transmitting a selection signal for selecting the subpixel to be supplied with a data signal. The scanning line 130 is provided above the planarization film 124 and connected with the gate electrode part 119 of the oxide semiconductor TFT 142 through a contact hole opened through the planarization film 124 and the interlayer insulating film 121.

FIG. 4 provides reference signs to the layers including a conductive element. In the following example, the conductor layers are metal layers. Specifically, the gate electrode part 107 of the low-temperature polysilicon TFT 141 is included in a metal layer M1. The lower electrode part 111 of the storage capacitor 143 and the source/drain electrode parts 109 and 110 of the low-temperature polysilicon TFT 141 are included in a metal layer M2.

The gate electrode part 119 of the oxide semiconductor TFT 142 and the upper electrode part 120 of the storage capacitor 143 are included in a metal layer M3. The source/drain electrode parts 122 and 123 of the oxide semiconductor TFT 142 and the connector 129 are included in a metal layer M4. The scanning line 130 is included in a metal layer M5. As described above, the gate insulator part of the oxide semiconductor TFT 142 and the insulator part of the storage capacitor 143 are included in the same high-k insulator layer.

Figure 5:
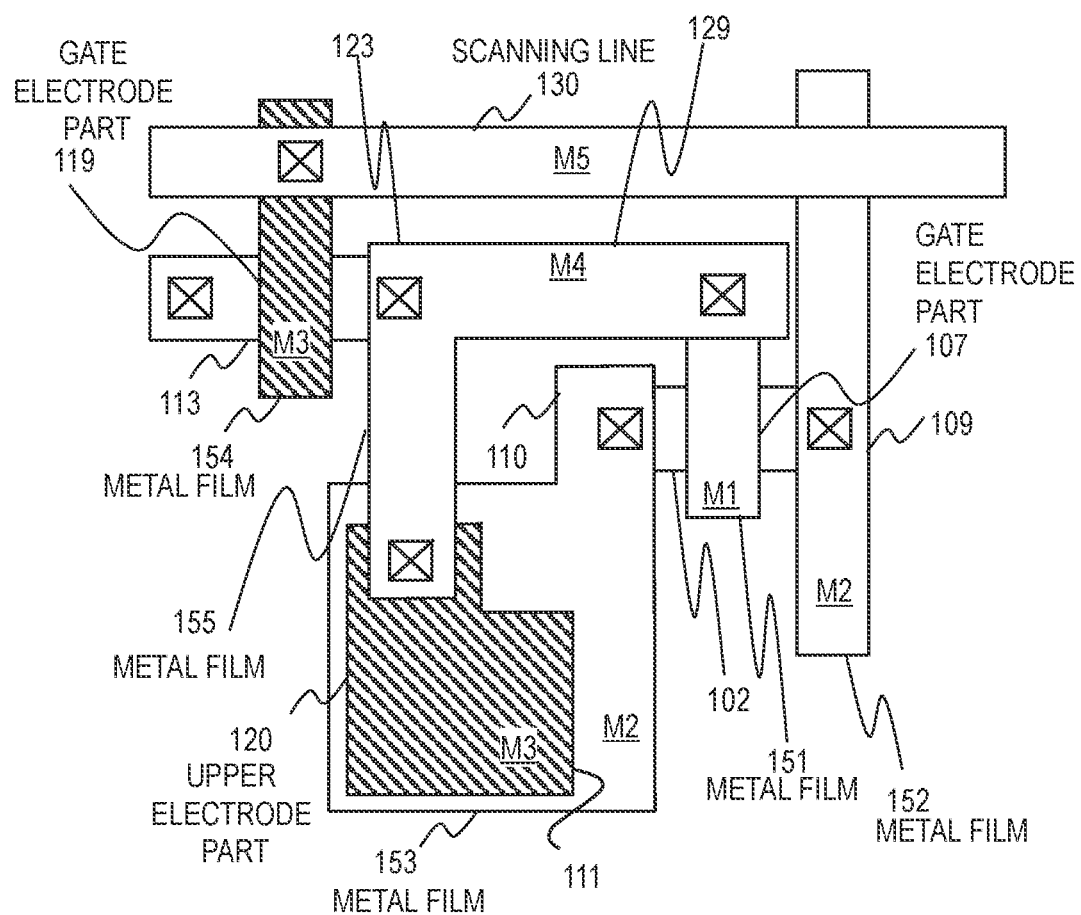
FIG. 5 is a plan diagram of a part of the TFT substrate.

FIG. 5 is a plan diagram of a part of the TFT substrate. The metal film 151 included in the lowermost metal layer M1 includes the gate electrode part 107 of the low-temperature polysilicon TFT 141. The gate electrode part 107 can be the overlap part of the metal film 151 with the low-temperature polysilicon part 102 when viewed planarly (in a layering direction).

The metal layer M2 upper than the metal layer M1 includes metal films 152 and 153. The metal film 152 includes the source/drain electrode part 109 of the low-temperature polysilicon TFT 141. The metal film 153 includes the source/drain electrode part 110 of the low-temperature polysilicon TFT 141 and the lower electrode part 111 of the storage capacitor 143. The lower electrode part 111 can be the overlap part of the metal film 153 with the upper electrode part 120 of the storage capacitor 143 when viewed planarly.

The metal layer M3 upper than the metal layer M2 includes a metal film 154 and a metal film corresponding to the upper electrode part 120 of the storage capacitor 143. The metal film 154 includes the gate electrode part 119 of the oxide semiconductor TFT 142 and the connector connecting the scanning line 130 and the gate electrode part 119. The gate electrode part 119 can be the overlap part of the metal film 154 with the oxide semiconductor part 113 when viewed planarly (in the layering direction). The upper electrode part 120 consists of one metal film. The upper electrode part 120 is smaller than the metal film 153 and the periphery of the upper electrode part 120 is located inner than the periphery of the metal film 153; the entire upper electrode part 120 is located within the area of the metal film 153.

A high-k insulator film including the gate insulator part 117 is disposed directly underneath the metal film 154. The entire area of this insulator film is covered with the metal film 154. In an example, the periphery of this insulator film coincides with the periphery of the metal film 154. Further, the insulator part 118 of the storage capacitor 143 of a high-k insulator film is disposed directly underneath the upper electrode part 120 of the storage capacitor 143. The entire area of this insulator part (insulator film) 118 is covered with the upper electrode part 120. In an example, the periphery of this insulator part 118 coincides with the periphery of the upper electrode part 120.

As described above, the gate insulator part 117 and the insulator part 118 are included in the same high-k insulator layer. The insulator films including the gate insulator parts of the other oxide semiconductor TFTs in the pixel circuit are all covered with metal films including the gate electrode parts in the same manner. The gate insulator parts of all oxide semiconductor TFTs in the pixel circuit are included in the same high-k insulator layer. The entire area of the high-k insulator layer including these insulator parts is covered with the metal layer M3 in the pixel circuit. This configuration suppresses the increase of parasitic capacitance caused by the high-k insulator.

The metal layer M4 upper than the metal layer M3 includes a metal film 155. The metal film 155 includes the source/drain electrode part 123 of the oxide semiconductor TFT 142 and a connector 129 interconnecting the source/drain electrode part 123, the upper electrode part 120, and the gate electrode part 107 of the low-temperature polysilicon TFT 141.

The metal layer M5 upper than the metal layer M4 includes the scanning line 130. Since the scanning line 130 connected with the gate electrode part 119 of the oxide semiconductor TFT 142 is provided on a metal layer different from the layer of the gate electrode part 119, no high-k insulator is provided under the scanning line 130, suppressing the parasitic capacitance.

In an example of a pixel circuit, the conductor that is located lower than the high-k insulator layer and overlaps the high-k insulator layer when viewed planarly is only the lower electrode part 111 of the storage capacitor 143. Further, the semiconductors overlapping the high-k insulator layer are only the oxide semiconductor parts of all oxide semiconductor TFTs in the pixel circuit. This configuration effectively suppresses the generation of parasitic capacitance caused by the high-k insulator. The whole insulator part of the storage capacitor 143 can be made of an insulator different from a high-k insulator, such as silicon oxide or silicon nitride.

Figure 6:
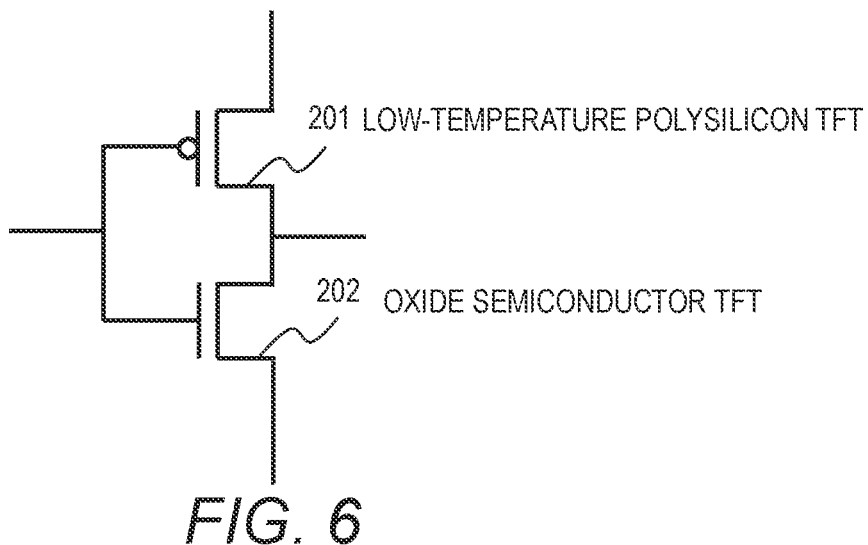
FIG. 6 illustrates an example of a CMOS circuit.

Next, a configuration of a CMOS circuit included in the driver circuit 31 or 32 on the TFT substrate is described. FIG. 6 illustrates an example of a CMOS circuit. The CMOS circuit includes a p-channel type of low-temperature polysilicon TFT 201 and an n-channel type of oxide semiconductor TFT 202. A source/drain of the low-temperature polysilicon TFT 201 is connected with a source/drain of the n-channel type of oxide semiconductor TFT 202. The gate of the low-temperature polysilicon TFT 201 and the gate of the oxide semiconductor TFT 202 are connected and they are supplied with the same signal.

Figure 7:
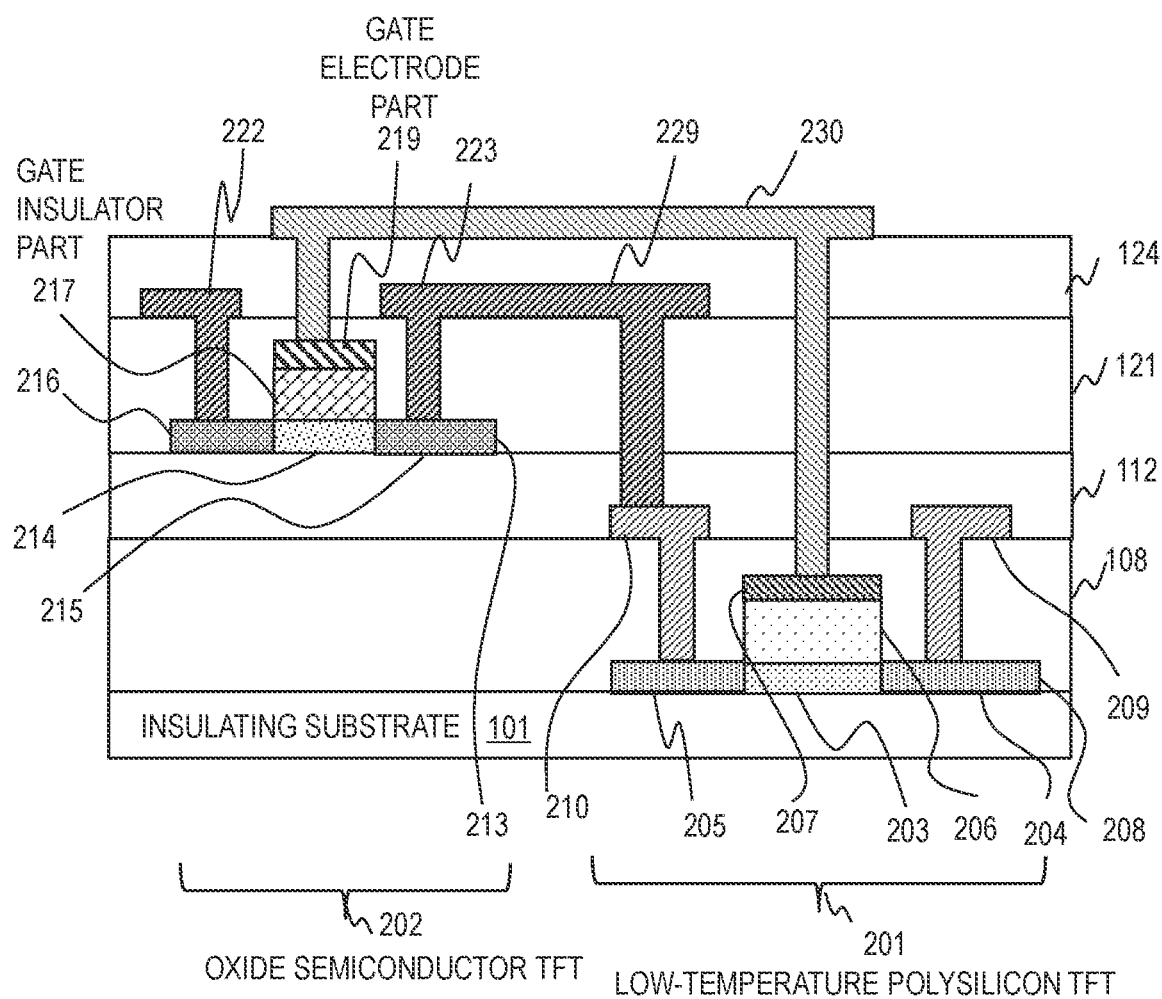
FIG. 7 schematically illustrates an example of the cross-sectional structure of the CMOS circuit illustrated in FIG. 6.

FIG. 7 schematically illustrates an example of the cross-sectional structure of the CMOS circuit illustrated in FIG. 6. Differences from the example of the cross-sectional structure illustrated in FIG. 3 are mainly described. In the configuration example of FIG. 7, the storage capacitor 143 in the configuration example of FIG. 3 is excluded. Moreover, the source/drain electrode part 210 of the low-temperature polysilicon TFT 201 and the source/drain electrode part 223 of the oxide semiconductor TFT 202 are connected and further, the gate electrode part 207 and the gate electrode part 219 are connected.

The low-temperature polysilicon TFT 201 in FIG. 7 can have the same configuration as the low-temperature polysilicon TFT 141 in FIG. 3. Their sizes can be different. The low-temperature polysilicon TFT 201 includes a low-temperature polysilicon part 208, a gate insulator part 206, and a gate electrode part 207. The low-temperature polysilicon part 208 includes a channel region 203 and source/drain regions 204 and 205. The source/drain electrode parts 209 and 210 are connected with the source/drain regions 204 and 205 through contact holes in the interlayer insulating film 108.

The low-temperature polysilicon part 208, the gate insulator part 206, the gate electrode part 207, and the source/drain electrode parts 209 and 210 respectively correspond to the low-temperature polysilicon part 102, the gate insulator part 106, the gate electrode part 107, and the source/drain electrode parts 109 and 110 in FIG. 3. Each element is included in the same layer as the corresponding element.

The oxide semiconductor TFT 202 in FIG. 7 can have the same configuration as the oxide semiconductor TFT 142 in FIG. 3. Their sizes can be different. The oxide semiconductor TFT 202 includes an oxide semiconductor part 213, a gate insulator part 217, and a gate electrode part 219. The oxide semiconductor part 213 includes a channel region 214 and source/drain regions 215 and 216. The oxide semiconductor part 213, the gate insulator part 217, and the gate electrode part 219 respectively correspond to the oxide semiconductor part 113, the gate insulator part 117, and the gate electrode part 119 in FIG. 3. Each element is included in the same layer as the corresponding element.

The connector 229 is continued from the source/drain electrode part 223 of the oxide semiconductor TFT 202 and connected with the source/drain electrode part 210 of the low-temperature polysilicon TFT 201 through a contact hole opened through the interlayer insulating films 112 and 121. The connector 230 is connected with the gate electrode part 219 of the oxide semiconductor TFT 202 through a contact hole opened through the interlayer insulating film 121 and the planarization film 124. The connector 230 is also connected with the gate electrode part 207 of the low-temperature polysilicon TFT 201 through a contact hole opened through the interlayer insulating films 108, 112, and 121 and the planarization film 124. The connector 230 is included in a metal layer M5.

Like in the configuration described with reference to FIG. 3, the gate insulator part 217 of the oxide semiconductor TFT 202 is included in a high-k insulator layer. In the driver circuits 31 and 32, the entire area of the insulator film including the gate insulator part of each oxide semiconductor TFT is covered with a metal film including the gate electrode part of the oxide semiconductor TFT.

The gate insulator parts of all oxide semiconductor TFTs in the driver circuits 31 and 32 are included in the same high-k insulator layer. The entire area of the high-k insulator layer including these insulator parts is covered with the metal layer including the gate electrode part 219 of the oxide semiconductor TFT 202 in the driver circuit. This configuration of the insulator layer suppresses the increase of parasitic capacitance caused by the high-k insulator. In an example, the periphery of each high-k insulator film coincides with the periphery of the metal film covering it.

In the driver circuits 31 and 32, the conductors and semiconductors that are located lower than the high-k insulator layer and overlap the high-k insulator layer when viewed planarly are only the oxide semiconductor parts of the one or more oxide semiconductor TFTs in the driver circuits or the oxide semiconductor parts of the one or more oxide semiconductor TFTs and the lower electrode parts of one or more capacitors in the driver circuits. This configuration effectively suppresses the generation of parasitic capacitance caused by the high-k insulator.

Manufacturing Method

Figure 8A:
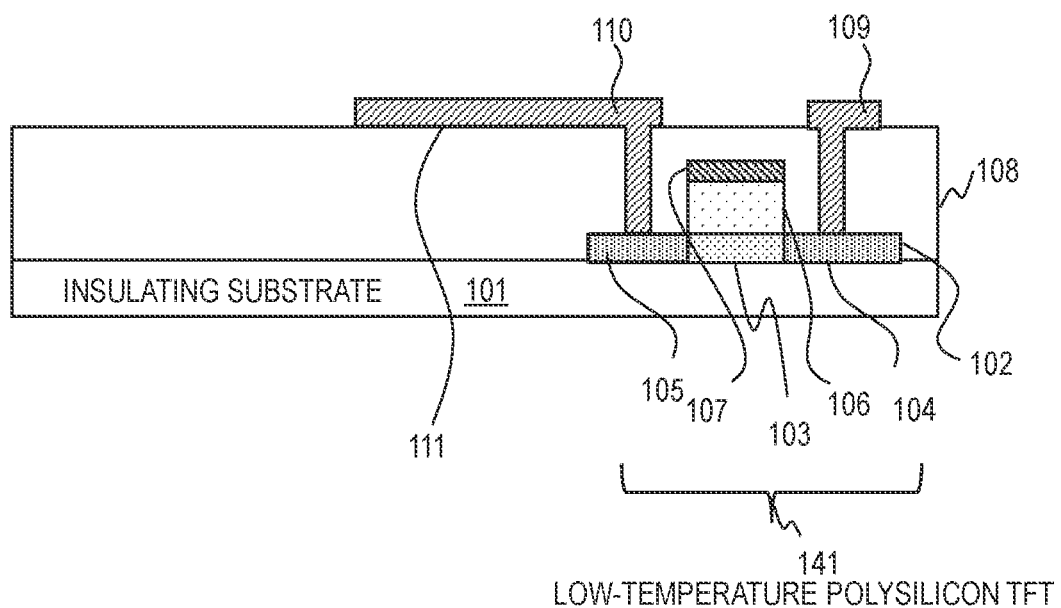
FIG. 8A illustrates a step of an example of the method of manufacturing the structure illustrated in FIG. 3.

A method of manufacturing the structure illustrated in FIG. 3 is described with reference to FIGS. 8A to 8F. As illustrated in FIG. 8A, the manufacturing fabricates a low-temperature polysilicon TFT 141. The manufacturing first forms a low-temperature polysilicon part 102 on an insulating substrate 101. Specifically, the manufacturing deposits amorphous silicon by CVD and crystalizes the amorphous silicon by excimer laser annealing to form a low-temperature polysilicon film. The manufacturing patterns the low-temperature polysilicon film by photolithography to form an island-like polysilicon part 102.

Next, the manufacturing forms an insulator layer (for example, a SiOx film) including a gate insulator part 106 by CVD, for example. Further, the manufacturing forms a metal layer M1 (see FIG. 4) by sputtering and patterns (etches) the metal layer M1 and the insulator layer by photolithography together (by the same process using the same mask) to form a gate electrode part 107 and a gate insulator part 106. As a result of this process, the insulator remains only underneath the metal layer M1. Another example of the manufacturing first etches the metal layer including the gate electrode part 107 and subsequently etches the insulator layer thereunder using the metal layer M1 as a mask.

Further, the manufacturing injects impurities to the low-temperature polysilicon part 102 using the gate electrode part 107 as a mask to generate low-resistive regions 104 and 105. The highly resistive region covered with the gate electrode part 107 corresponds to a channel region 103.

Next, the manufacturing forms an interlayer insulating film 108 by CVD and further, opens contact holes in the layered insulating films by anisotropic etching. Further, the manufacturing forms a metal layer M2 (see FIG. 4) by sputtering and patterns the metal layer M2 by photolithography to form source/drain electrode parts 109 and 110 and a lower electrode part 111 of a storage capacitor 143 (see FIG. 4).

Figure 8B:
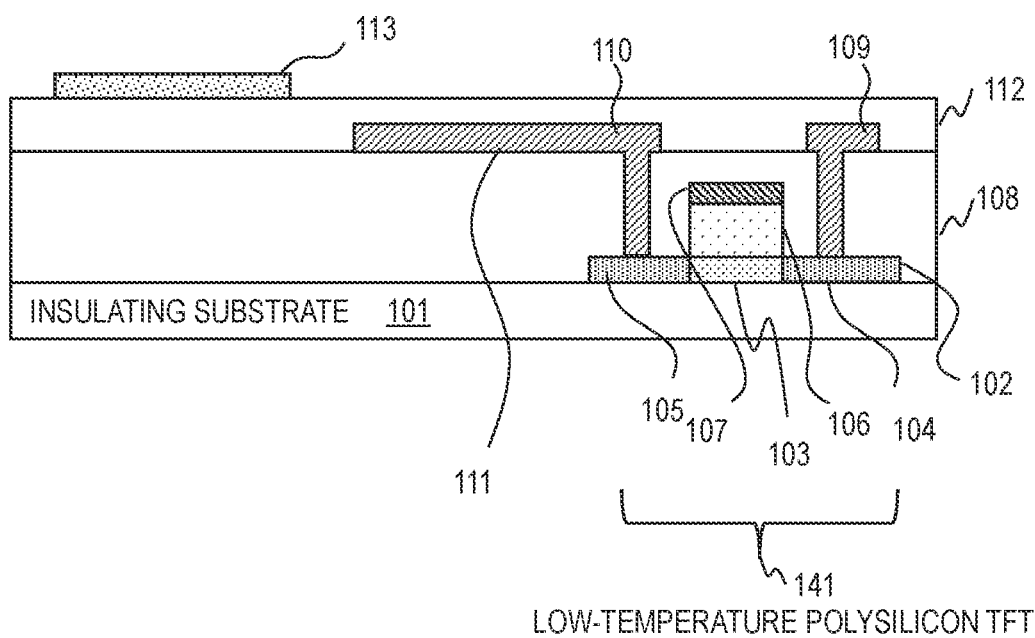
FIG. 8B illustrates a step of an example of the method of manufacturing the structure illustrated in FIG. 3.

Next, with reference to FIG. 8B, the manufacturing forms an interlayer insulating film 112 by CVD on the interlayer insulating film 108 and the source/drain electrode parts 109 and 110. Next, the manufacturing forms an oxide semiconductor layer by sputtering and patterns the oxide semiconductor layer by photolithography. As a result, an island-like oxide semiconductor part 113 of the oxide semiconductor TFT 142 (see FIG. 4) is formed.

Figure 8C:
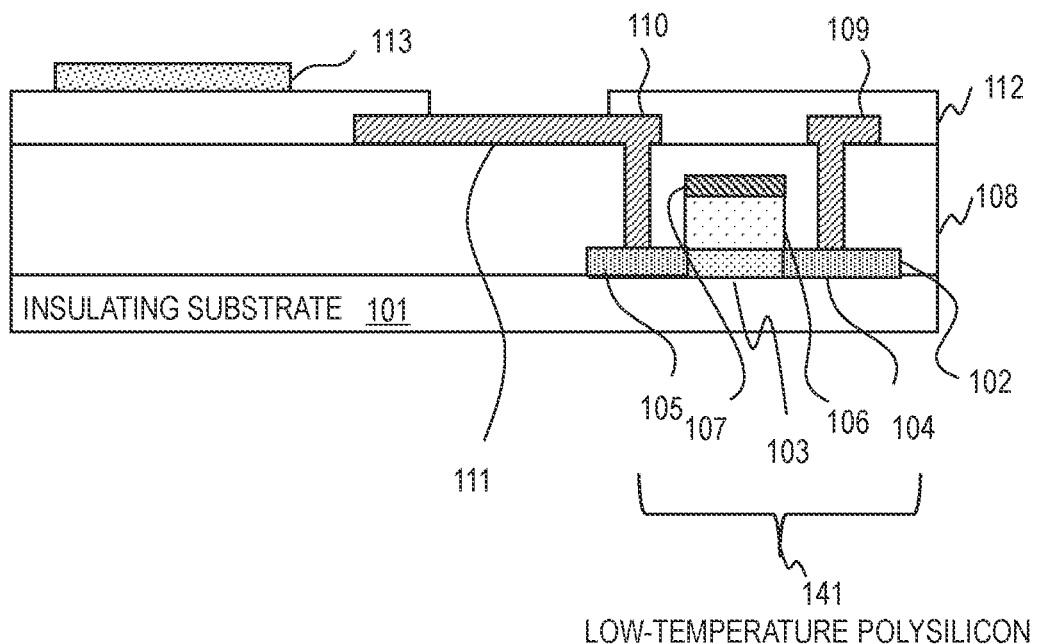
FIG. 8C illustrates a step of an example of the method of manufacturing the structure illustrated in FIG. 3.

Next, with reference to FIG. 8C, the manufacturing removes a part of the interlayer insulating film 112 by etching to expose a part of the lower electrode part 111 of the storage capacitor 143 (see FIG. 4) from the opening of the interlayer insulating film 112.

Figure 8D:
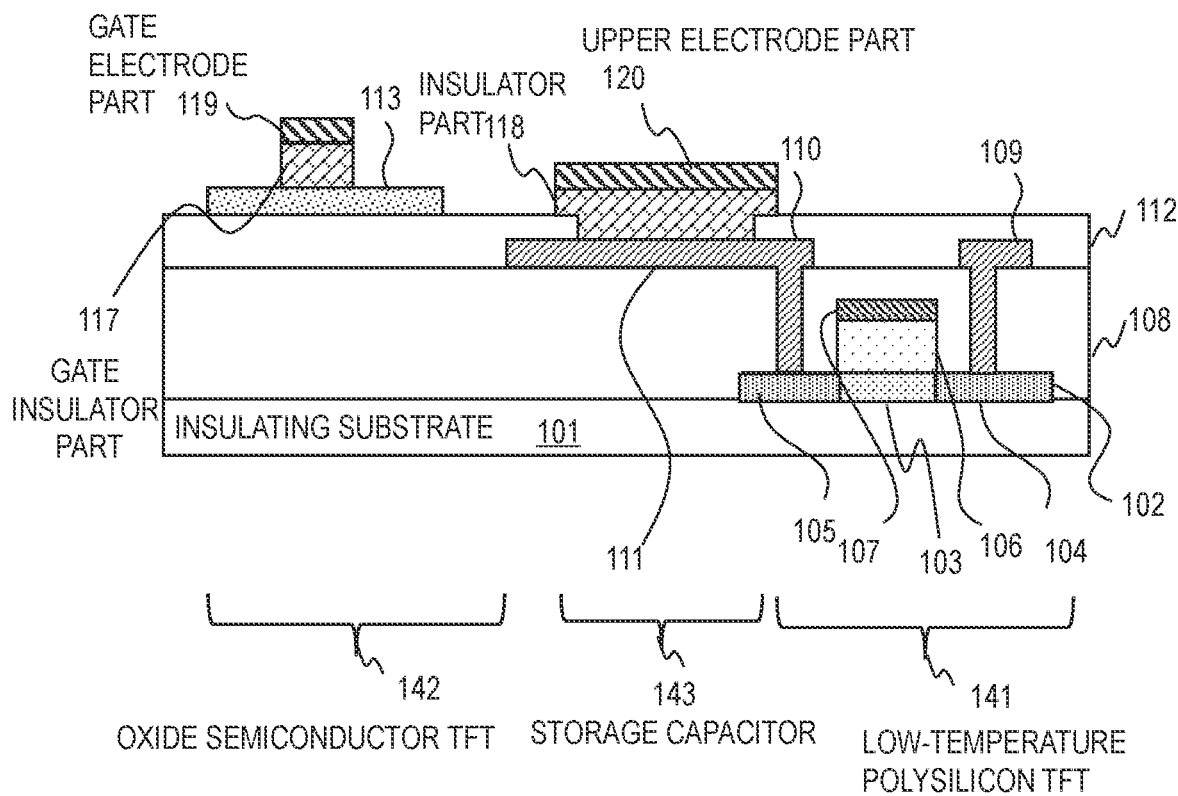
FIG. 8D illustrates a step of an example of the method of manufacturing the structure illustrated in FIG. 3.

Next, with reference to FIG. 8D, the manufacturing forms a high-k insulator film by sputtering. The manufacturing further forms a metal layer M3 (see FIG. 4) by sputtering. The manufacturing patterns (etches) the metal layer M3 and the high-k insulator film by photolithography together (by the same process with the same mask) to form a gate electrode part 119 of the oxide semiconductor TFT 142, an upper electrode part 120 of the storage capacitor 143, a gate insulator part 117 of the oxide semiconductor TFT 142, and an insulator part 118 of the storage capacitor 143.

As a result of this process, the high-k insulator remains only underneath the metal layer M3 and the remaining area of the high-k insulator layer is covered with the metal layer M3 in its entirety. Another example of the manufacturing patterns the metal layer M3 to form a gate electrode part 119 and an upper electrode part 120 and subsequently patterns the high-k insulator layer using the metal layer (metal pattern) M3 as a mask. The insulator part 118 of the storage capacitor 143 is also provided inside the opening in the interlayer insulating film 112. This configuration increases the average relative permittivity of the storage capacitor 143, providing the storage capacitor 143 with higher electrostatic capacity.

Figure 8E:
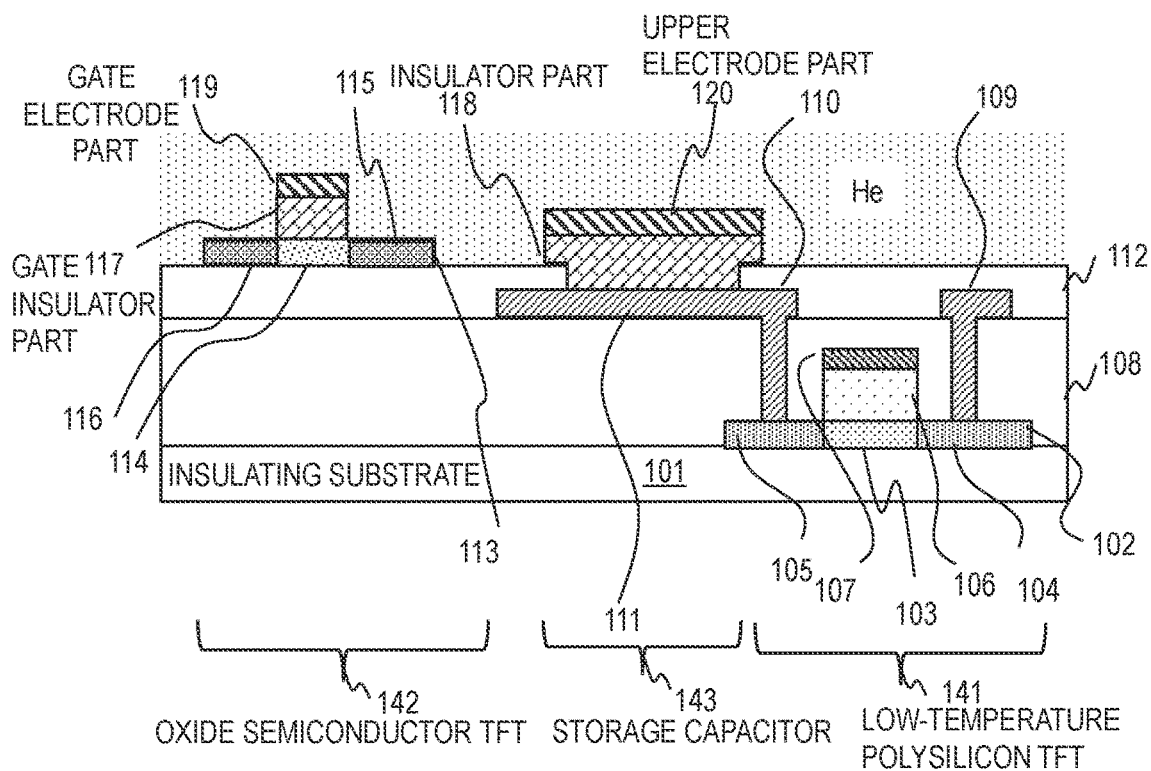
FIG. 8E illustrates a step of an example of the method of manufacturing the structure illustrated in FIG. 3.

Next, with reference to FIG. 8E, the manufacturing reduces the resistance of the end regions 115 and 116 of the oxide semiconductor part 113 using the gate electrode part 119 as a mask. The resistance can be reduced by exposing the oxide semiconductor part 113 in the regions that are not covered with the gate electrode part 119 to He plasma. The region 114 covered with the gate electrode part 119 corresponds to a highly resistive channel region. Reducing the resistance can be performed in the next step of forming an interlayer insulating film 121.

Figure 8F:
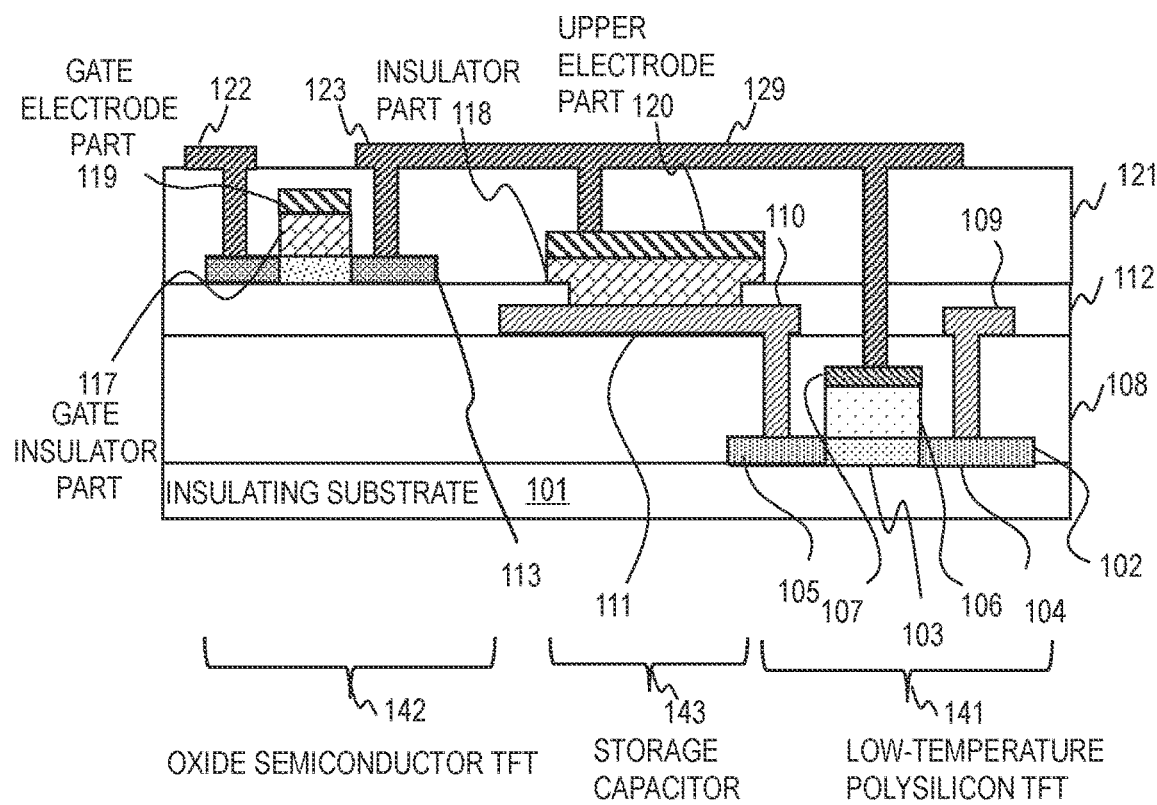
FIG. 8F illustrates a step of an example of the method of manufacturing the structure illustrated in FIG. 3.

Next, with reference to FIG. 8F, the manufacturing forms an interlayer insulating film 121 by CVD and anisotropically etches the interlayer insulating film 121 by photolithography to open contact holes. Further, the manufacturing forms a metal layer M4 (see FIG. 4) by sputtering and patterns the metal layer M4 by photolithography. As a result, source/drain electrode parts 122 and 123 of the oxide semiconductor TFT 142 and a connector 129 are formed.

Although not shown in the drawings, the manufacturing further forms a planarization film 124 and a metal layer M5 and subsequently forms an anode electrode part 125. Furthermore, the manufacturing forms a pixel defining layer 126 and subsequently forms an organic light-emitting film on the anode electrode part 125. Forming the organic light-emitting film deposits organic light-emitting material by vapor deposition at the location corresponding to a pixel through a metal mask. The manufacturing further deposits a metal material for a cathode electrode part 128.

Embodiment 2

Figure 9:
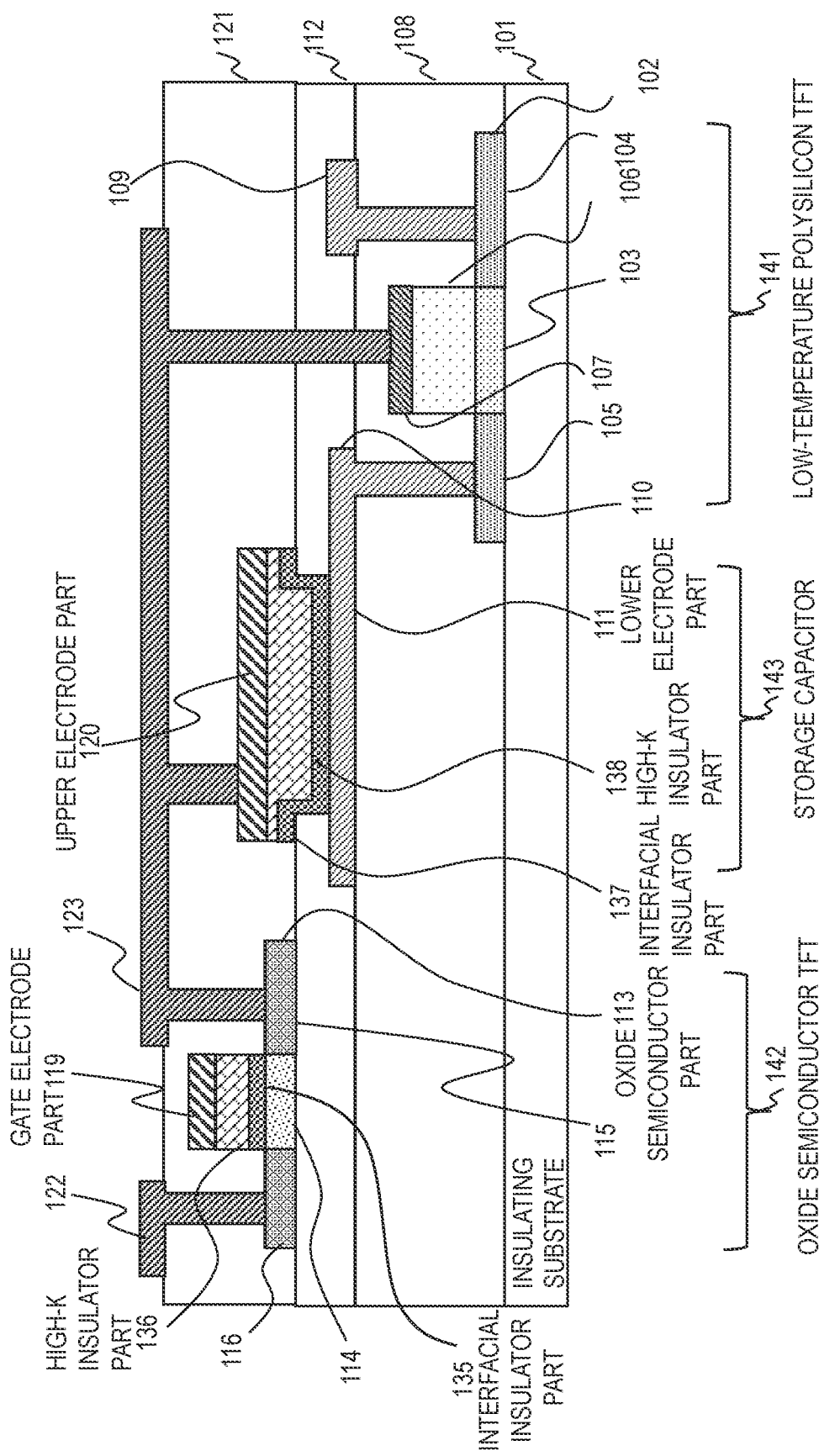
FIG. 9 schematically illustrates a cross-sectional structure of a part of a pixel circuit in Embodiment 2.

Described hereinafter is an example of a circuit including an oxide semiconductor TFT having a different structure from the one in Embodiment 1. FIG. 9 schematically illustrates a cross-sectional structure of a part of a pixel circuit. The following mainly describes differences from the configuration illustrated in FIG. 3.

The gate insulator part of the oxide semiconductor TFT 142 is composed of a plurality of layered insulator parts, specifically, a high-k insulator part 136 and an interfacial insulator part 135. The interfacial insulator part 135 has interfaces with a high-k insulator part 136 and the oxide semiconductor part 113.

In an example, the interfacial insulator part 135 is included in a silicon-based insulator layer including the interfacial insulator parts of other oxide semiconductor TFTs. An example of the silicon-based insulator layer is made of silicon oxide (SiOx). Another example is made of silicon nitride. Interposing a silicon-based insulator between the high-k insulator and the oxide semiconductor stabilizes the characteristics of the oxide semiconductor TFT 142.

Silicon oxide has a relative permittivity lower than the relative permittivity of the high-k insulator. The interfacial insulator part 135 can be thinner than the high-k insulator part 136. This configuration prevents the overall relative permittivity of the gate insulator part from becoming low.

In another example, the interfacial insulator part 135 is made of a high-k insulator containing carbon element (carbon-containing high-k insulator) and the high-k insulator part 136 is made of a high-k insulator that substantially does not contain carbon element (carbon-free high-k insulator). The interfacial insulator part 135 is included in a carbon-containing high-k insulator layer including the interfacial insulator parts of other oxide semiconductor TFTs. The high-k insulator part 136 is included in a carbon-free high-k insulator layer including the high-k insulator parts of the other oxide semiconductor TFTs. Interposing the carbon-containing high-k insulator between the carbon-free high-k insulator and the oxide semiconductor stabilizes the characteristics of the oxide semiconductor TFT 142.

The interfacial insulator part 135 made of a carbon-containing high-k insulator can be thinner than the high-k insulator part 136 made of a carbon-free high-k insulator. The carbon-free high-k insulator can be formed into a film by common sputtering. On the other hand, the carbon-containing high-k insulator is formed into a film by atomic layer deposition (ALD), which is a CVD using an organic metal as a precursor. Film formation of the carbon-containing high-k insulator takes longer than film formation of the carbon-free high-k insulator. Accordingly, the above-described relationship of the film thicknesses achieves a shorter process time.

In the meanwhile, the characteristics of the oxide semiconductor TFT 142 is more stabilized when the concentration of carbon in the carbon-containing high-k insulator is not less than $1\times10^{18}$ cm$^{-3}$ and the concentration of carbon in the carbon-free high-k insulator is less than $1\times10^{18}$ cm$^{-3}$.

In the configuration example of FIG. 9, the whole insulator part of the storage capacitor 143 consists of an interfacial insulator part 137, a high-k insulator part 138, and a part of the interlayer insulating film 112. The interfacial insulator part 137 is included in the same layer as the interfacial insulator part 135. The high-k insulator part 138 is included in the same layer as the high-k insulator part 136.

The metal layer M3, the insulator layer including the interfacial insulator parts 135 and 137, and the insulator layer including the high-k insulator parts 136 and 138 have identical planar shapes. The layered structure of these can be formed by etching the two insulator layers together with the metal layer M3 (by the same process using the same mask) or by etching the two insulator layers using the metal layer M3 as a mask. The interfacial insulator part 137 is optional.

Figure 10:
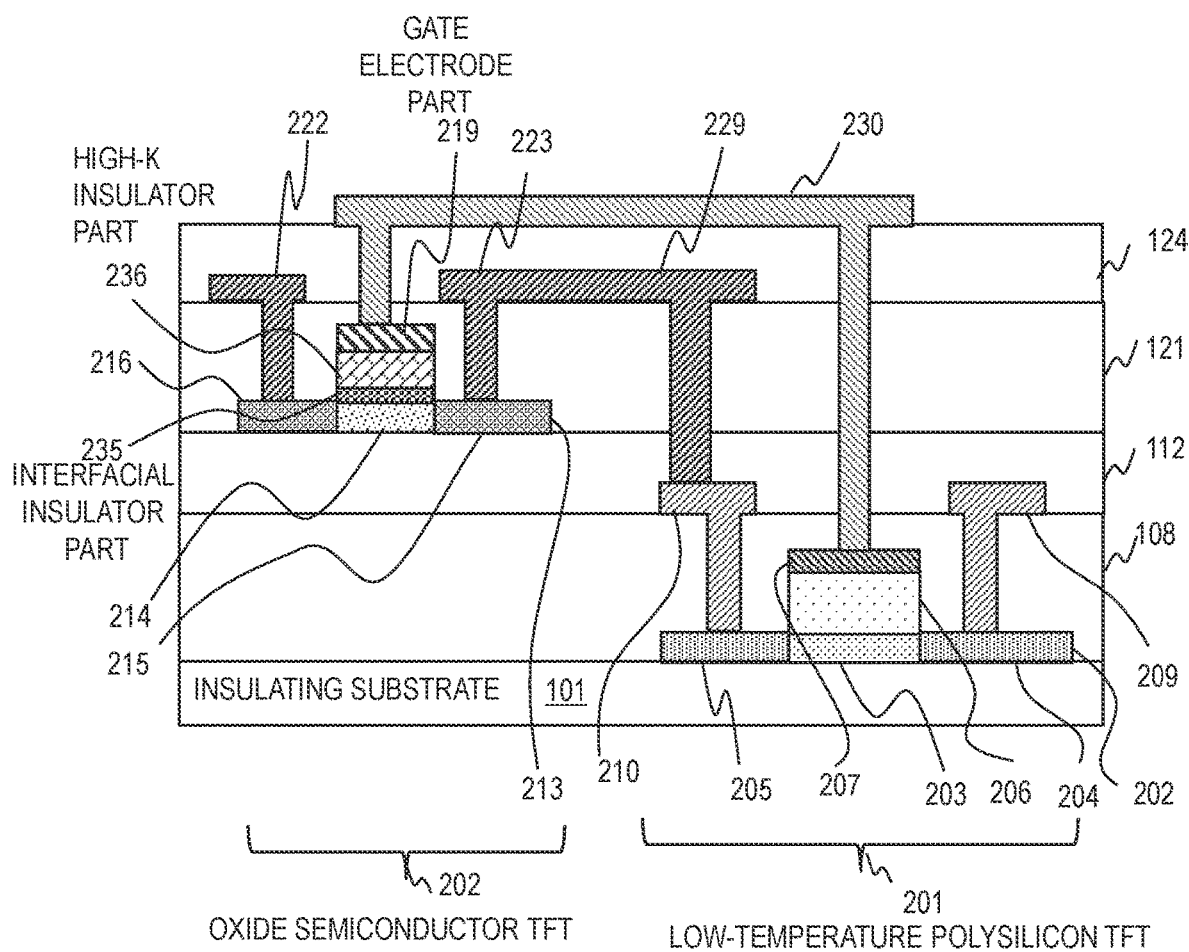
FIG. 10 schematically illustrates a cross-sectional structure of a CMOS circuit in Embodiment 2.

FIG. 10 schematically illustrates a cross-sectional structure of a CMOS circuit. Differences from the configuration example illustrated in FIG. 7 are mainly described. The gate insulator part of the oxide semiconductor TFT 202 consists of a high-k insulator part 236 and an interfacial insulator part 235. The high-k insulator part 236 can be included in the same layer as the high-k insulator parts 136 and 138. The interfacial insulator part 235 can be included in the same layer as the interfacial insulator parts 135 and 137.

The interfacial insulator part 235 has interfaces with the high-k insulator part 236 and the oxide semiconductor part 213. In an example, the interfacial insulator part 235 can be made of silicon oxide (SiOx). Interposing silicon oxide between the high-k insulator and the oxide semiconductor stabilizes the characteristics of the oxide semiconductor TFT 202.

The interfacial insulator part 235 can be thinner than the high-k insulator part 236. This configuration prevents the overall relative permittivity of the gate insulator part from becoming low.

In another example, the interfacial insulator part 235 is made of a carbon-containing high-k insulator and the high-k insulator part 236 is made of a carbon-free high-k insulator. This configuration stabilizes the characteristics of the oxide semiconductor TFT 202. The interfacial insulator part 235 made of a carbon-containing high-k insulator can be thinner than the high-k insulator part 236 made of a carbon-free high-k insulator. This relationship of film thicknesses achieves a shorter process time.

Embodiment 3

Hereinafter, another configuration example of an oxide semiconductor TFT is described. The oxide semiconductor TFT described in the following includes a layer of a compound of the high-k insulator and the oxide semiconductor as an interfacial layer between the source/drain regions of the oxide semiconductor part and the source/drain electrode parts. The interfacial layer has interfaces with each source/drain region and each source/drain electrode part. The interfacial layer provides good contact characteristics between the source/drain region and the source/drain electrode part. The described in the following is an oxide semiconductor TFT having a top-gate structure, but the interfacial layer is applicable to an oxide semiconductor TFT having a bottom-gate structure.

Figure 11:
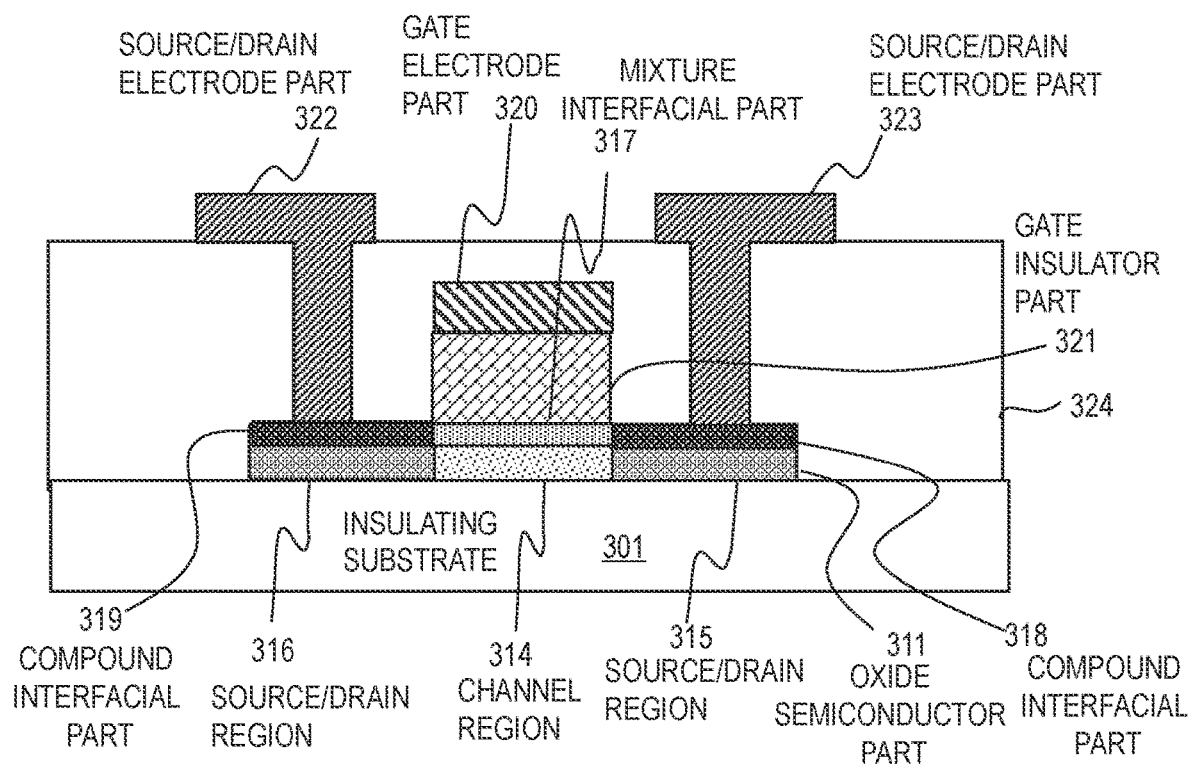
FIG. 11 is a cross-sectional diagram of a configuration example of an oxide semiconductor TFT in Embodiment 3.

FIG. 11 is a cross-sectional diagram of such a configuration example of an oxide semiconductor TFT. The oxide semiconductor TFT is fabricated on an insulating substrate 301. An example of the oxide semiconductor is IGZO. The oxide semiconductor TFT includes an oxide semiconductor part 311. The oxide semiconductor part 311 can be one island-like oxide semiconductor active film and includes source/drain regions 315 and 316 and a channel region 314 between the source/drain regions 315 and 316 in an in-plane direction.

The source/drain regions 315 and 316 are made of an oxide semiconductor reduced in resistance. The channel region 314 is made of the oxide semiconductor not reduced in resistance. A mixture interfacial part 317 made of a mixture of the oxide semiconductor and the high-k insulator is provided above the channel region 314. The high-k insulator can be a high dielectric as mentioned in Embodiment 1 or a ferroelectric (such as PZT) having remanent polarization. The mixture interfacial part 317 has interfaces with the gate insulator part 321 made of a high-k insulator and the channel region 314.

Above the source/drain regions 315 and 316, compound interfacial parts 318 and 319 made of a compound of the oxide semiconductor and the high-k insulator are provided. The source/drain regions 315 and 316 are connected with the source/drain electrode parts 322 and 323 through the compound interfacial parts 318 and 319. The compound interfacial part 318 has interfaces with the source/drain electrode part 323 and the source/drain region 315 and the compound interfacial part 319 has interfaces with the source/drain electrode part 322 and the source/drain region 316.

In an example where $InGaZnO_x$ is used as the oxide semiconductor and $AlO_y$ is used as the high-k insulator, the mixture interfacial part 317 can be expressed as $(IGZO_x + AlO_y)$. The compound interfacial parts 318 and 319 can be expressed as $(IGZO_{x-1}AlO_{y+1})$. As noted from this example, oxygen deficiency in the oxide semiconductor increases in the compound interfacial parts 318 and 319. As a result, the resistance of the compound interfacial parts 318 and 319 become lower than the resistance of source/drain regions 315 and 316, attaining better contact characteristics and on-current characteristics.

The compound interfacial parts 318 and 319 can be composed of not only the aforementioned elements of the oxide semiconductor and the high-k insulator (for example, In—Ga—Zn—Al—O) but also elements included in the process gas in the manufacturing steps. For example, when the films are exposed to fluorine-containing plasma as will be described later, the compound interfacial parts 318 and 319 can be composed of In—Ga—Zn—Al—F—O. As described above, the high-k insulator can include an element of Ta or Hf, other than Al.

The gate electrode part 320 is laid above the gate insulator part 321. The gate electrode part 320 is made of a conductor; for example, a metal such as Mo, W, Nb, or Al can be employed. Like the configurations in the foregoing other embodiments, the entire area of the insulator layer including the gate insulator part 321 is covered with the metal layer including the gate electrode part 320 in the oxide semiconductor TFT.

An interlayer insulating film 324 is provided to cover the above-described elements of the oxide semiconductor part. The interlayer insulating film 324 can be a silicon oxide film. The source/drain electrode parts 322 and 323 of the oxide semiconductor TFT are provided above the interlayer insulating film 324. The source/drain electrode parts 322 and 323 are connected with the source/drain regions 315 and 316 through contact holes in the interlayer insulating film 324 and the compound interfacial parts 318 and 319.

Figure 12:
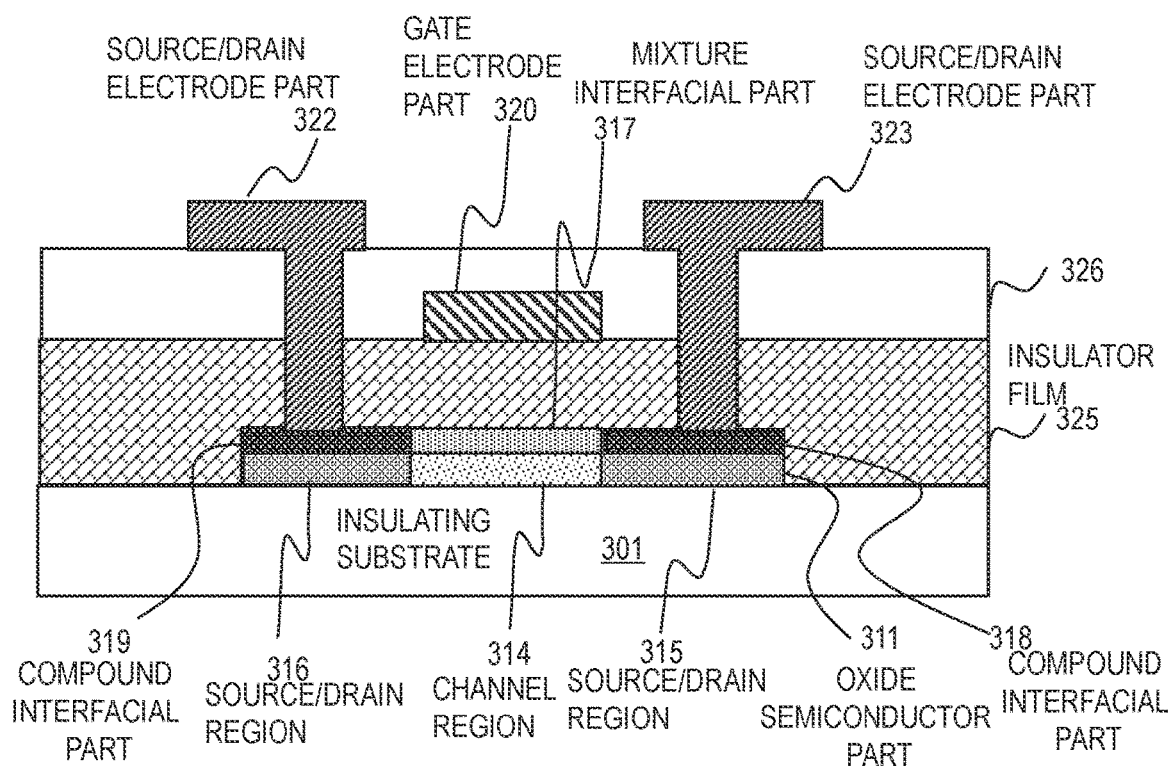
FIG. 12 is a cross-sectional diagram of another configuration example of an oxide semiconductor TFT in Embodiment 3.

FIG. 12 is a cross-sectional diagram of another configuration example of an oxide semiconductor TFT. Differences from the configuration example in FIG. 11 are mainly described. In the oxide semiconductor TFT in FIG. 12, the high-k insulator part located between the gate electrode part 320 and the oxide semiconductor part 311 is included in a high-k insulator film 325 extended to the outside of the gate electrode part 320. The high-k insulator film 325 covers the oxide semiconductor part 311. Unlike the configurations in Embodiments 1 and 2, the compound interfacial parts 318 and 319 are applicable to the circuits in which the high-k insulator extends from the region underneath the gate electrode part to the outside thereof.

These compound interfacial parts are generated when the surface of the oxide semiconductor part 311 is exposed to fluorine-containing plasma before the high-k insulator film 325 is deposited. The compound interfacial parts are further reduced in resistance by the kinetic energy and the thermal energy of the particles (plasma particles and radical particles) in formation of the high-k insulator film 325. In the configurations illustrated in FIGS. 11 and 12, the gate insulator part 321 can have a layered structure of a lower layer of a high-k insulator and an upper layer of a low-k insulator having a relative permittivity lower than 8.

Figure 13A:
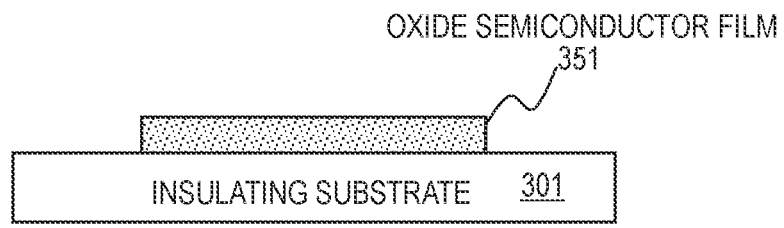
FIG. 13A illustrates a step of an example of the method of manufacturing the oxide semiconductor TFT illustrated in FIG. 11.

Next, an example of the method of manufacturing the oxide semiconductor TFT illustrated in FIG. 11 is described with reference to FIGS. 13A to 13F. With reference to FIG. 13A, the manufacturing forms an oxide semiconductor layer on an insulating substrate 301 by sputtering and patterns the oxide semiconductor layer by photolithography. As a result, an island-like oxide semiconductor film 351 is formed.

Figure 13B:
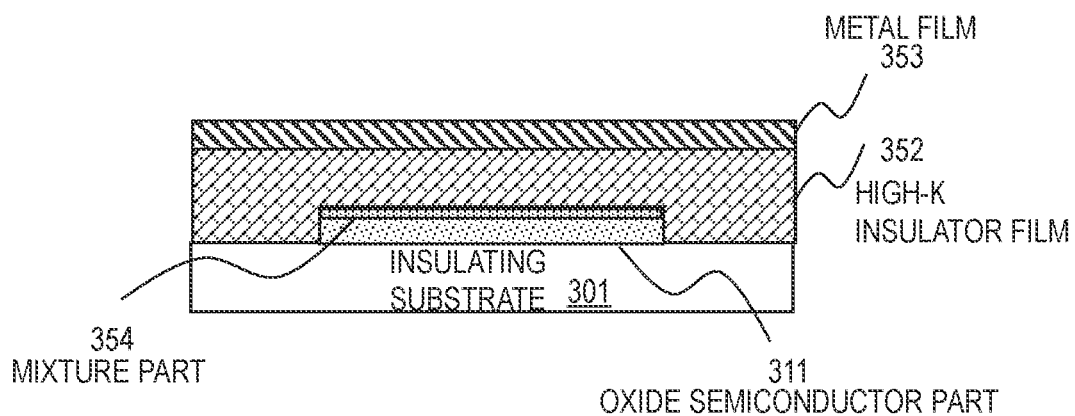
FIG. 13B illustrates a step of an example of the method of manufacturing the oxide semiconductor TFT illustrated in FIG. 11.

Next with reference to FIG. 13B, the manufacturing forms a high-k insulator film 352 by sputtering. As a result, a mixture part 354 of the high-k insulator and the oxide semiconductor is generated in the oxide semiconductor film 351. The layer under the mixture part 354 is an oxide semiconductor part 311 composed of only the oxide semiconductor. Further, the manufacturing forms a metal film 353 by sputtering.

Figure 13C:
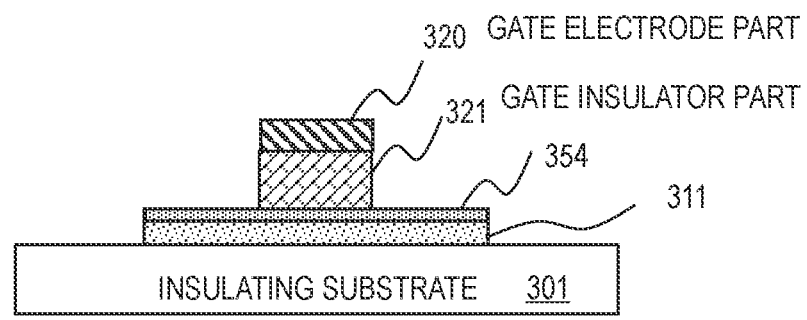
FIG. 13C illustrates a step of an example of the method of manufacturing the oxide semiconductor TFT illustrated in FIG. 11.

Next, with reference to FIG. 13C, the manufacturing etches the metal film 353 and the high-k insulator film 352 together (by the same process using the same mask) in the patterning by photolithography to form a gate electrode part 320 and a gate insulator part 321. In another example, the manufacturing etches the metal film 353 and subsequently etches the high-k insulator film 352 using the gate electrode part 320 as a mask to form a gate insulator part 321.

Figure 13D:
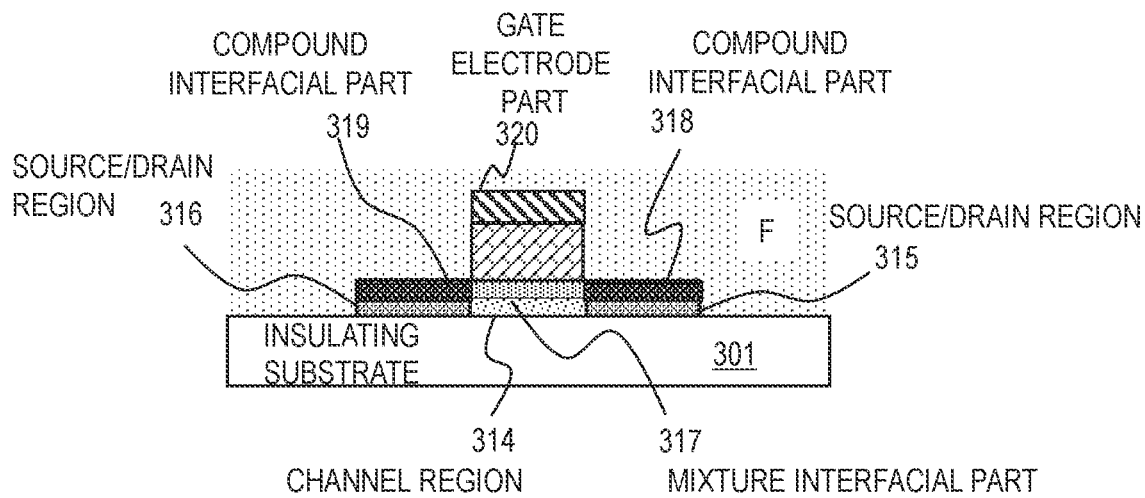
FIG. 13D illustrates a step of an example of the method of manufacturing the oxide semiconductor TFT illustrated in FIG. 11.

Next, with reference to FIG. 13D, the manufacturing exposes the mixture part 354 and the oxide semiconductor part 311 to fluorine plasma in the area uncovered with the gate electrode part 320 used as a mask. As a result of this process, the compound interfacial parts 318 and 319 and source/drain regions 315 and 316 are generated. The compound interfacial parts 318 and 319 can contain an element of fluorine in addition to the elements composing the oxide semiconductor and the high-k insulator. The region between the compound interfacial parts 318 and 319 corresponds to the mixture interfacial part 317 and the region between the source/drain regions 315 and 316 corresponds to a highly resistive channel region 314. This process using fluorine plasma can be pursued by exposing the mixture part 354 and the oxide semiconductor part 311 to plasma of a gas such as $CF_4$ after performing the etching as illustrated in FIG. 13C.

Figure 13E:
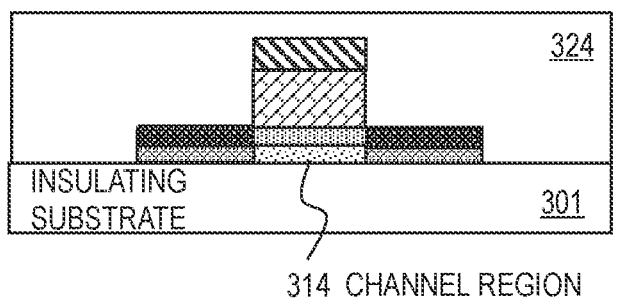
FIG. 13E illustrates a step of an example of the method of manufacturing the oxide semiconductor TFT illustrated in FIG. 11.
Figure 13F:
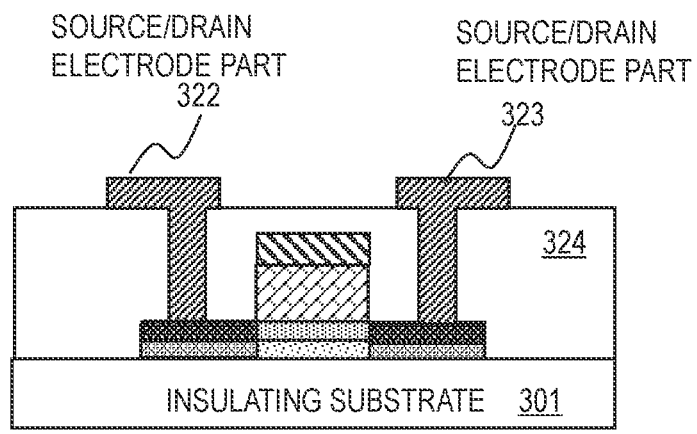
FIG. 13F illustrates a step of an example of the method of manufacturing the oxide semiconductor TFT illustrated in FIG. 11.

Next, with reference to FIG. 13E, the manufacturing forms an interlayer insulating film 324 by CVD. Next, with reference to FIG. 13F, the manufacturing anisotropically etches the interlayer insulating film 324 by photolithography to open contact holes in the interlayer insulating film 324. Further, the manufacturing forms a metal film by sputtering and patterns the metal film by photolithography. As a result, the source/drain electrode parts 322 and 323 of the oxide semiconductor TFT are formed.

Figure 14:
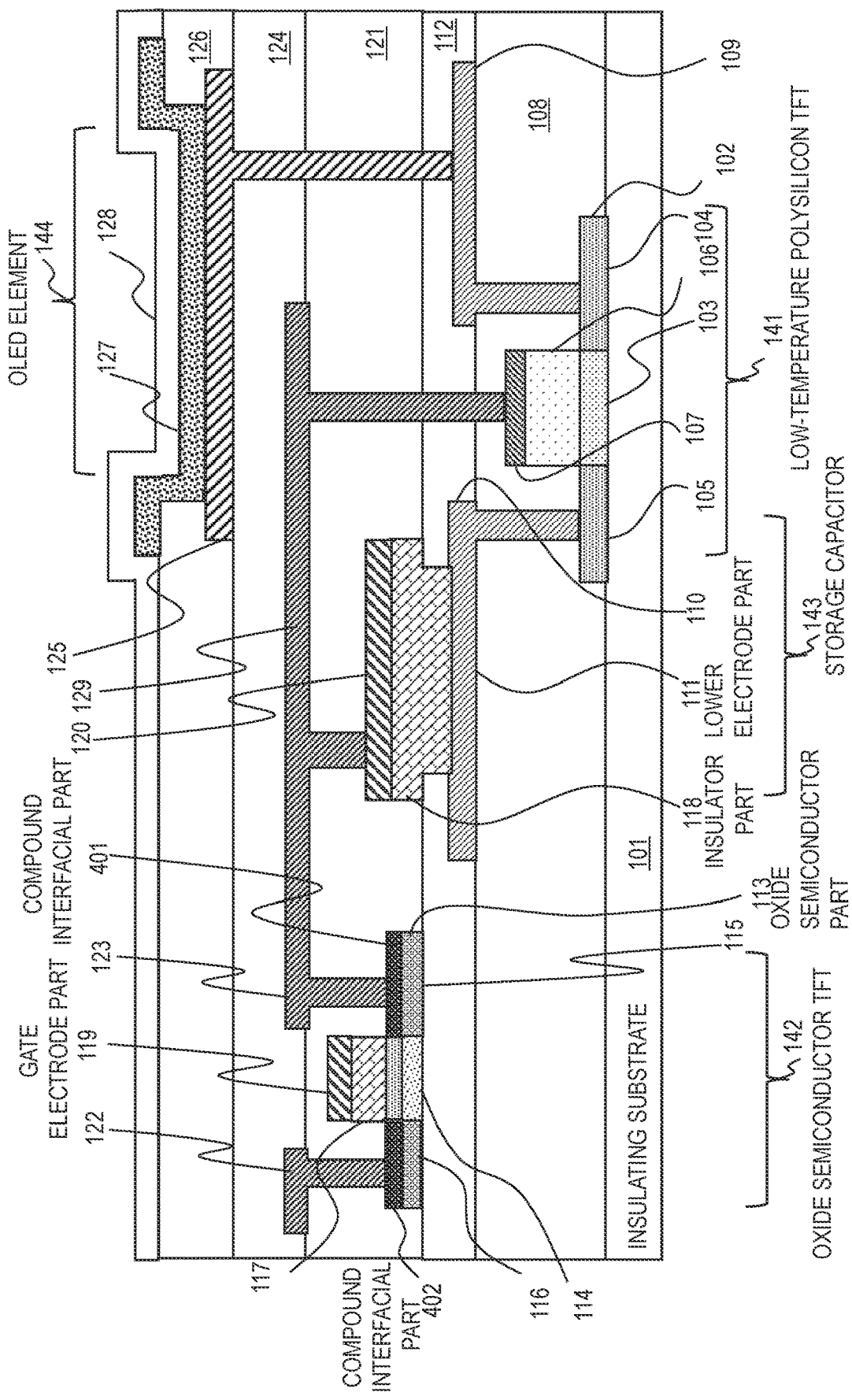
FIG. 14 illustrates an example where an oxide semiconductor TFT having the structure illustrated in FIG. 11 is applied to the pixel circuit illustrated in FIG. 4.
Figure 15:
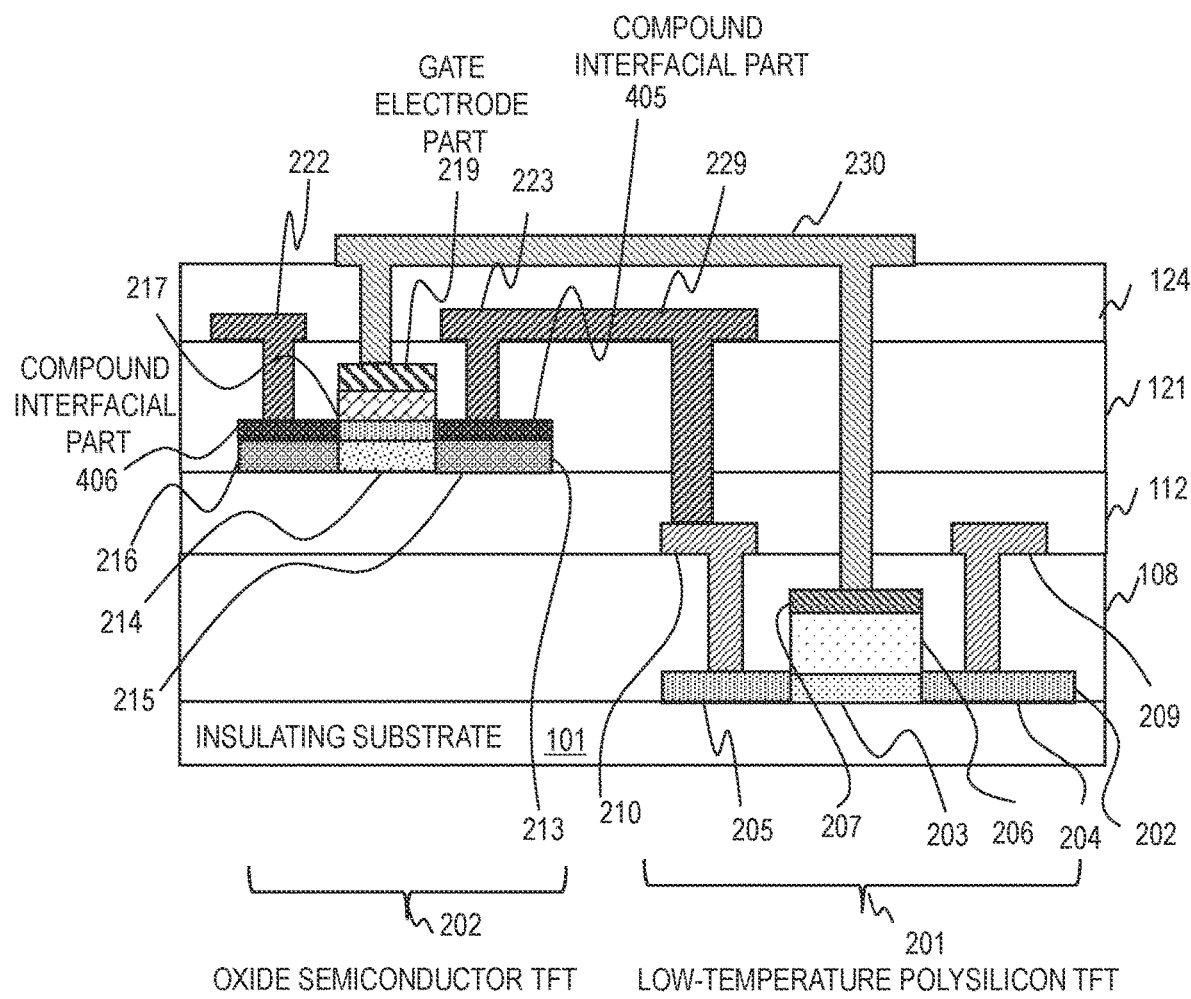
FIG. 15 illustrates an example where an oxide semiconductor TFT having the structure illustrated in FIG. 11 is applied to the CMOS circuit illustrated in FIG. 7.

FIGS. 14 and 15 illustrate examples where an oxide semiconductor TFT having the structure described with reference to FIG. 11 is applied to the pixel circuit illustrated in FIG. 4 and the CMOS circuit illustrated in FIG. 7. In the pixel circuit of FIG. 14, the oxide semiconductor TFT 142 includes compound interfacial parts 401 and 402. In the CMOS circuit of FIG. 15, the oxide semiconductor TFT 202 includes compound interfacial parts 405 and 406. These circuits exhibit the effects described in Embodiment 1 and Embodiment 3. As noted from these examples, the oxide semiconductor TFT in this embodiment is applicable to various kinds of circuits.

The compound interfacial parts described in Embodiment 3 and the interfacial insulator part described in Embodiment 2 can be applied to one oxide semiconductor TFT. Such a configuration provides the oxide semiconductor TFT with higher operating stability and better on-current characteristics.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A circuit comprising:
    a polysilicon thin-film transistor comprising:
        a polysilicon layer;
        a first conductor layer located above the polysilicon layer; and
        a first insulator layer located between the first conductor layer and the polysilicon layer; and
    an oxide semiconductor thin-film transistor comprising:
        an oxide semiconductor layer;
        a second conductor layer located above the oxide semiconductor layer; and
        a second insulator layer located between the second conductor layer and the oxide semiconductor layer,
    wherein the polysilicon layer includes a polysilicon part of the polysilicon thin-film transistor,
    wherein the first conductor layer includes a first gate electrode part of the polysilicon thin-film transistor,
    wherein the first insulator layer includes a first insulator part located between the first gate electrode part and the polysilicon part,
    wherein the oxide semiconductor layer includes an oxide semiconductor part of the oxide semiconductor thin-film transistor,
    wherein the second conductor layer includes a second gate electrode part of the oxide semiconductor thin-film transistor,
    wherein the second insulator layer includes a second insulator part located between the second gate electrode part and the oxide semiconductor part,
    wherein the second insulator layer has a relative permittivity of not less than 8,
    wherein the entire area of the second insulator layer is covered with the second conductor layer,
    wherein the first insulator layer has a relative permittivity lower than the relative permittivity of the second insulator layer,
    wherein the second conductor layer includes an upper electrode part of a capacitive element, and
    wherein the second insulator layer includes an insulator part of the capacitive element,
    wherein the second conductor layer of the oxide semiconductor thin-film transistor is above of the upper electrode part of the capacitive element,
wherein the second insulator layer of the oxide semiconductor thin-film transistor is above of the insulator part of the capacitive element.

2. The circuit according to claim 1,
    wherein the oxide semiconductor part includes a channel region and source/drain regions sandwiching the channel region, and
    wherein one of the source/drain regions is connected with the first gate electrode part.

3. The circuit according to claim 1,
    wherein the oxide semiconductor part includes a channel region and source/drain regions sandwiching the channel region,
    wherein the polysilicon part includes a channel region and source/drain regions sandwiching the channel region, and
    wherein one of the source/drain regions of the oxide semiconductor part is connected with one of the source/drain regions of the polysilicon part.

4. The circuit according to claim 1, further comprising a silicon-based insulator part having an interface with the oxide semiconductor part and another interface with the second insulator part.

5. The circuit according to claim 1, further comprising an interfacial insulator part having an interface with the oxide semiconductor part and another interface with the second insulator part, wherein the interfacial insulator part has a relative permittivity of not less than 8, and wherein a concentration of carbon in the interfacial insulator part is not less than $1 \times 10^{18}$ cm$^{-3}$ and a concentration of carbon in the second insulator part is less than $1 \times 10^{18}$ cm$^{-3}$.

6. A circuit comprising:
a polysilicon thin-film transistor comprising:
  a polysilicon layer;
  a first conductor layer located above the polysilicon layer;
  a first insulator layer located between the first conductor layer and the polysilicon layer; and
an oxide semiconductor thin-film transistor comprising:
  an oxide semiconductor layer;
  a second conductor layer located above the oxide semiconductor layer; and
  a second insulator layer located between the second conductor layer and the oxide semiconductor layer,
wherein the polysilicon layer includes a polysilicon part of the polysilicon thin-film transistor,
wherein the first conductor layer includes a first gate electrode part of the polysilicon thin-film transistor,
wherein the first insulator layer includes a first insulator part located between the first gate electrode part and the polysilicon part,
wherein the oxide semiconductor layer includes an oxide semiconductor part of the oxide semiconductor thin-film transistor,
wherein the second conductor layer includes a second gate electrode part of the oxide semiconductor thin-film transistor,
wherein the second insulator layer includes a second insulator part located between the second gate electrode part and the oxide semiconductor part,
wherein the second insulator layer has a relative permittivity of not less than 8,
wherein the entire area of the second insulator layer is covered with the second conductor layer,
wherein the oxide semiconductor part includes a channel region and source/drain regions sandwiching the channel region, and
wherein the oxide semiconductor thin-film transistor includes compound interfacial parts each located above a source/drain region, the compound interfacial parts including constituent elements of the oxide semiconductor part and constituent elements of the second insulator layer and having a resistance lower than a resistance of the channel region, wherein the second conductor layer of the oxide semiconductor thin-film transistor is above of the upper electrode part of a capacitive element, wherein the second insulator layer of the oxide semiconductor thin-film transistor is above of the insulator part of the capacitive element.

7. A method of manufacturing a circuit, the method comprising:
  forming a polysilicon thin-film transistor, wherein the forming the polysilicon thin-film transistor comprises:
    forming a polysilicon layer including a polysilicon part of the polysilicon thin-film transistor;
    forming a first insulator layer including an insulator part of the polysilicon thin-film transistor on a layer above the polysilicon layer;
    forming a first conductor layer including a gate electrode part of the polysilicon thin-film transistor on a layer than above the first insulator layer; and
  forming an oxide semiconductor thin-film transistor, wherein the forming the oxide semiconductor thin-film transistor comprises:
    forming an oxide semiconductor layer including an oxide semiconductor part of the oxide semiconductor thin-film transistor;
    forming a second insulator layer including an insulator part of the oxide semiconductor thin-film transistor on a layer above the oxide semiconductor layer; and
    forming a second conductor layer including a gate electrode part of the oxide semiconductor thin-film transistor on a layer above the second insulator layer,
wherein the second insulator layer has a relative permittivity of not less than 8, and
wherein the second conductor layer and the second insulator layer are etched together or the second insulator layer is etched using the second conductor layer as a mask,
wherein the first insulator layer has a relative permittivity lower than the relative permittivity of the second insulator layer,
wherein the second conductor layer includes an upper electrode part of a capacitive element, and
wherein the second insulator layer includes an insulator part of the capacitive element, wherein the second conductor layer of the oxide semiconductor thin-film transistor is above of the upper electrode part of the capacitive element, wherein the second insulator layer of the oxide semiconductor thin-film transistor is above of the insulator part of the capacitive element.

* * * * *